(12) United States Patent
Saito

(10) Patent No.: US 8,203,256 B2
(45) Date of Patent: Jun. 19, 2012

(54) TUNING-FORK TYPE PIEZOELECTRIC VIBRATING PIECE, PIEZOELECTRIC FRAME, PIEZOELECTRIC DEVICE, AND A MANUFACTURING METHOD OF TUNING-FORK TYPE PIEZOELECTRIC VIBRATING PIECE AND PIEZOELECTRIC FRAME

(75) Inventor: Takefumi Saito, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 108 days.

(21) Appl. No.: 12/702,844

(22) Filed: Feb. 9, 2010

(65) Prior Publication Data
US 2010/0201229 A1 Aug. 12, 2010

(30) Foreign Application Priority Data
Feb. 10, 2009 (JP) ................................. 2009-028468

(51) Int. Cl.
*H01L 41/04* (2006.01)

(52) U.S. Cl. ........................................ 310/370; 310/329

(58) Field of Classification Search .................. 310/312, 310/329, 370
See application file for complete search history.

(56) References Cited

U.S. PATENT DOCUMENTS

| 6,065,339 A * | 5/2000 | Takeuchi et al. | 73/504.12 |
| 2009/0001856 A1* | 1/2009 | Hara et al. | 310/348 |
| 2009/0021120 A1* | 1/2009 | Dalla Piazza et al. | 310/370 |

FOREIGN PATENT DOCUMENTS
JP 2005-354649 12/2005

* cited by examiner

*Primary Examiner* — Derek Rosenau
(74) *Attorney, Agent, or Firm* — Alix, Yale & Ristas, LLP

(57) ABSTRACT

A tuning-fork type crystal vibrating piece (20) is comprised of a base portion (23) comprising a piezoelectric material, a pair of parallel vibrating arms (21) with a designated thickness (D3) and width (W3) extend from the base portion, and a pair of weight portions (28) are formed by enlarging the width (W4) of the distal ends pair of vibrating arms. A cross-section of the pair of weight portions is formed symmetric with a central axis which is center of the pair of vibrating arms, and at least one portion of the pair of weight portions has a thickness which is less than the designated thickness (D3).

15 Claims, 15 Drawing Sheets

FIG.12A
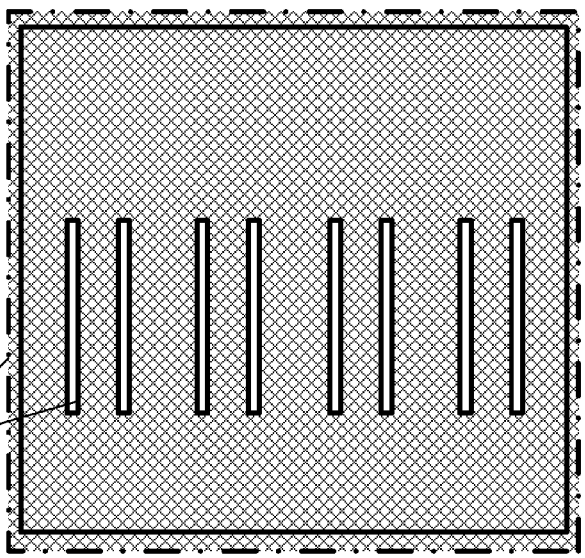
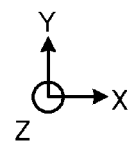
FIG.12B
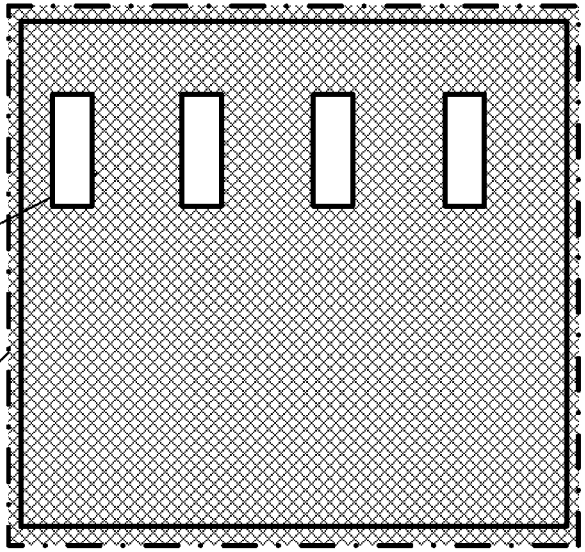
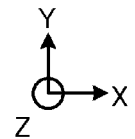
FIG.12C
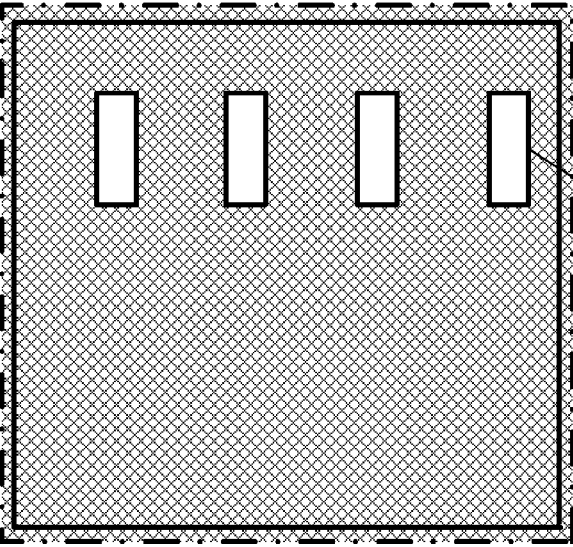
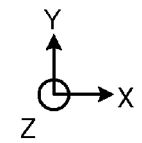

TUNING-FORK TYPE PIEZOELECTRIC VIBRATING PIECE, PIEZOELECTRIC FRAME, PIEZOELECTRIC DEVICE, AND A MANUFACTURING METHOD OF TUNING-FORK TYPE PIEZOELECTRIC VIBRATING PIECE AND PIEZOELECTRIC FRAME

CROSS-REFERENCE TO RELATED APPLICATION

This application claims priority to and the benefit of Japan Patent Application No. 2009-028468, filed on Feb. 10, 2009, in the Japan Patent Office, the disclosure of which is incorporated herein by reference in its entirety.

FIELD

The present disclosure relates generally to piezoelectric devices and more specifically to a tuning-fork type piezoelectric vibrating piece of piezoelectric frame that oscillates at a designated frequency formed by using a piezoelectric substrate such as crystal.

DESCRIPTION OF THE RELATED ART

Various types of clocks, home electric appliances, consumer electronics, and various types of commercial/industrial electrical apparatus such as information/communication devices and Office-Automation devices utilize at least one oscillator. These oscillators typically are manufactured by packaging a piezoelectric resonator, a piezoelectric vibrating device, or an IC chip as a clock source for addition to and use by an electronic circuit of the apparatus. In other apparatus, piezoelectric timing devices such as real-time clock modules are widely used. Especially nowadays, piezoelectric vibrating devices must be increasingly miniaturized and/or provided with a thin or low profile so as to be correspondingly accommodated in electronic devices that likewise are miniaturized and/or provided with a low profile.

As miniaturization of electric devices becomes more common, there is increased demand for a miniaturized tuning-fork type piezoelectric vibrating piece for a piezoelectric device used for such electric devices. A miniaturized tuning-fork type piezoelectric vibrating piece has a pair of vibrating arms having a shorter length and a narrower width. However, the frequency of the tuning-fork type piezoelectric vibrating piece is in inverse proportion to square of the length of the vibrating arms, so that the frequency will be higher if the length of the vibrating arms is shorter. Japan Unexamined Patent Application No. 2005-354649 discloses weight portions at the distal end of the vibrating arms and formed at a designated position by enlarging the width of the distal ends of each vibrating arm. By forming the weight portions to make the weight of the distal ends heavier, frequency of the tuning-fork type piezoelectric vibrating piece can be lowered.

However, if the width of weight portions at the distal ends of the vibrating arms is widened in order to make them heavier, respective weight portions may easily collide with each other at the center of the arm's movement during flexural vibration. Thus, the width of weight portions must be designed such that the respective weight portions do not collide with each other during vibration.

An advantage of the present disclosure is to provide a tuning-fork type piezoelectric vibrating piece or a piezoelectric device in which weight portions formed at the distal ends of the vibrating arms do not collide with each other during flexural vibration when the weight portions are needed to be enlarged in a miniaturized device. Further, a method of manufacturing many small tuning-fork type piezoelectric vibrating pieces on a single crystal wafer is provided.

SUMMARY

A tuning-fork type crystal vibrating piece of a first aspect is comprised of a base portion having a piezoelectric material, a pair of parallel vibrating arms having a designated thickness and width extend from the base portion, and a pair of weight portions formed by enlarging the width of the distal ends of the pair of vibrating arms; wherein a cross-section of the pair of weight portions is formed symmetric with a central axis which is center of the pair of vibrating arms, and at least one portion of the pair of weight portions has a thickness which is less than the designated thickness.

According to the above-mentioned configuration, the cross-section of the pair of weight portions have at least one portion with a thickness less than half of the designated thickness so that the pair of weight portions do not collide with each other during flexural movement of the vibrating arms.

The tuning-fork type crystal vibrating piece of a second aspect is that edges of the weight portions that face each other with the central axis have a thickness less than a remainder of weight portions and when the pair of vibrating arms oscillates, the reduced thickness portions of the weight portions are separated by a space in a direction perpendicular to the direction of movement of the weight portion (the thickness direction of the weight portion).

The tuning-fork type crystal vibrating piece of a third aspect is that the reduced thickness portion of the weight portions has a thickness less than half of the designated thickness.

The tuning-fork type crystal vibrating piece of a fourth aspect is that a width of the weight portions varies from distal ends of the weight portions toward the base portion.

The tuning-fork type crystal vibrating piece of a fifth aspect is that the reduced thickness portions of the weight portions gradually decrease in width from the distal ends of the weight portions toward the base portion.

A piezoelectric frame of a sixth aspect is comprised of a base portion comprising a piezoelectric material, a pair of vibrating arms extends parallel from the base portion to a distal end, each of the vibrating arms having a designated thickness and width, a pair of weight portions formed by enlarging the width of the distal end of each vibrating arm, an outer frame portion surrounding the base portion and the vibrating arms; and supporting arms extending between the outer frame and the base portion, thereby supporting the base portion and the vibrating arms with respect to the outer frame, wherein the weight portion includes a skirt having a thickness which is less than the designated thickness.

According to the above-mentioned configuration, the cross-section of the pair of weight portions have at least one reduced thickness portion having a thickness less than half of the designated thickness so that the pair of vibrating arms do not collide with each other during flexural movement.

A piezoelectric frame of a seventh aspect is that a portion of the supporting arm has a thickness less than the designated thickness.

The cross-section of the pair of weight portions have at least one reduced thickness portion having a thickness less than half of the designated thickness so that the pair of vibrating arms do not collide with each other at flexural movement.

A piezoelectric frame of a eighth aspect is that the weight portions include a central portion intermediate inner and outer side skirts and both the inner and outer skirts of each of the weight portions have a thickness that is less than a thickness of the central portion and the inner skirts are formed on each weight portion so that the inner skirts may overlap without touching each other and the outer skirt and the portion of the supporting arm may overlap without touching each other when the pair of vibrating arms oscillates.

The piezoelectric frame of a ninth aspect is that each the weight portion has a width and a distal end and the width of each the skirts varies from the distal end of the weight portion toward the base portion.

The piezoelectric frame of a tenth aspect is that the weight portions have a thickness less than half of the designated thickness of the vibrating arms.

The piezoelectric frame of an eleventh aspect is that the whole weight portion has the same thickness as the skirt.

A manufacturing method of a tuning-fork type piezoelectric vibrating piece having a pair of parallel vibrating arms having a designated thickness extend from a base portion and each vibrating arm includes a distal end with a weight portion formed thereon, the manufacturing method of a twelfth aspect is comprised of a first exposing step exposing a profile of the tuning-fork type piezoelectric vibrating piece on a piezoelectric wafer having the designated thickness using a first mask corresponding to the profile of the tuning-fork type piezoelectric vibrating piece, a second exposing step exposing the piezoelectric wafer such that the weight portion becomes thinner than the piezoelectric wafer, a third exposing step exposing the piezoelectric wafer so as to form grooves at a root of the vibrating arms, a first etching step etching the piezoelectric wafer after the first exposing step, a second etching step etching the piezoelectric wafer after the second exposing step, and a third etching step etching the piezoelectric wafer after the third exposing step.

The cross-section of the pair of weight portions have at least one portion with a thickness less than half of the designated thickness so that the pair of vibrating arms do not collide with each other during flexural movement.

The manufacturing method of the piezoelectric frame of thirteenth aspect is that the second exposing step is to expose the piezoelectric wafer by using the second mask corresponding to a skirt having a thickness which is less than the designated thickness, the third exposing step is to expose the piezoelectric wafer using the third mask corresponding to the groove, and the second etching step and the third etching step are performed individually.

According to the above-mentioned configuration, the depth of the grooves formed by the second etching step and the depth of the weight portions formed by the third etching step can be controlled individually.

The manufacturing method of the piezoelectric frame of a fourteenth aspect is the second exposing step and the third exposing step comprise exposing the piezoelectric wafer by using a fourth mask corresponding to the portion of the cross-section of the weight portion and the groove at once, and the second etching step and the third etching step are performed concurrently.

According to the above-mentioned configuration, the weight portions and the reduced thickness portions thereof are formed at the same time as the grooves are formed by etching so that a manufacturing step can be reduced.

A manufacturing method of a piezoelectric frame having a tuning-fork type piezoelectric vibrating piece having a pair of parallel vibrating arms with a designated thickness extend from a base portion and a pair of weight portions formed on distal ends of the pair of vibrating arms, an outer frame surrounding the tuning-fork type piezoelectric vibrating piece, and a pair of supporting arms extend outwardly from the base portion and connect to the outer frame of a fifteenth aspect is comprised of a first exposing step exposing a profile of the tuning-fork type piezoelectric vibrating piece, the outer frame, and the supporting arms on a piezoelectric wafer having the designated thickness using a first mask corresponding to the profile of the tuning-fork type piezoelectric vibrating piece, the outer frame, and the supporting arms, a second exposing step exposing the piezoelectric wafer such that the weight portion becomes thinner than the piezoelectric wafer and a portion of the supporting arms becomes thinner than a remainder of the supporting arms; a third exposing step exposing the piezoelectric wafer so as to form grooves at a root of the vibrating arms, a first etching step etching the piezoelectric wafer after the first exposing step, a second etching step etching the piezoelectric wafer after the second exposing step; and, a third etching step etching the piezoelectric wafer after the third exposing step.

The manufacturing method of the piezoelectric frame of a sixteenth aspect is that the second exposing step is to expose the piezoelectric wafer by using a second mask corresponding to a skirt having a thickness which is less than the designated thickness and the portion of the supporting arms and the third exposing step is to expose the piezoelectric wafer using a third mask corresponding to the groove, and the second etching step and the third etching step are performed individually.

The manufacturing method of the piezoelectric frame of a seventeenth aspect is that the second exposing step and the third exposing step comprising exposing the piezoelectric wafer by using a fourth mask corresponding to a skirt having a thickness which is less than the designated thickness and the portion of the supporting arms simultaneously, and the second etching step and the third etching step are performed concurrently.

The piezoelectric vibrating piece according to aspects of the present disclosure enables low frequency vibration even after miniaturization because the weight portions are configured for easy frequency adjustment. Piezoelectric devices utilizing the disclosed piezoelectric vibrating piece meet a demand of miniaturization of electronic devices.

Preferred embodiments of the disclosed piezoelectric vibrating pieces and piezoelectric devices will be explained by referring figures below.

BRIEF DESCRIPTION OF THE DRAWINGS

FIG. 12A is a top view of a second photo mask 196-1 for forming the grooves 24.

FIG. 12B is a top view of a third photo mask 196-2 for forming one of weight portions 28.

FIG. 12C is a top view of a third photo mask 196-3 for forming the other of weight portions 28.

DETAILED DESCRIPTION

First Embodiment

<<Configuration of First Tuning-Fork Type Crystal Vibrating Piece>>

Figure 1A:
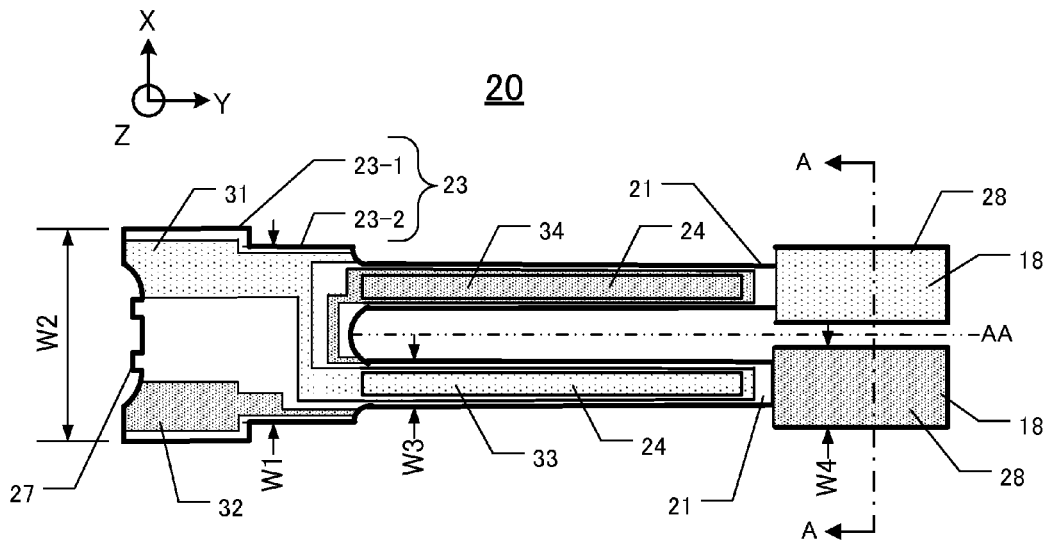
FIG. 1A is a top view of a first tuning-fork type crystal vibrating piece 20 of a first embodiment.
Figure 1B:
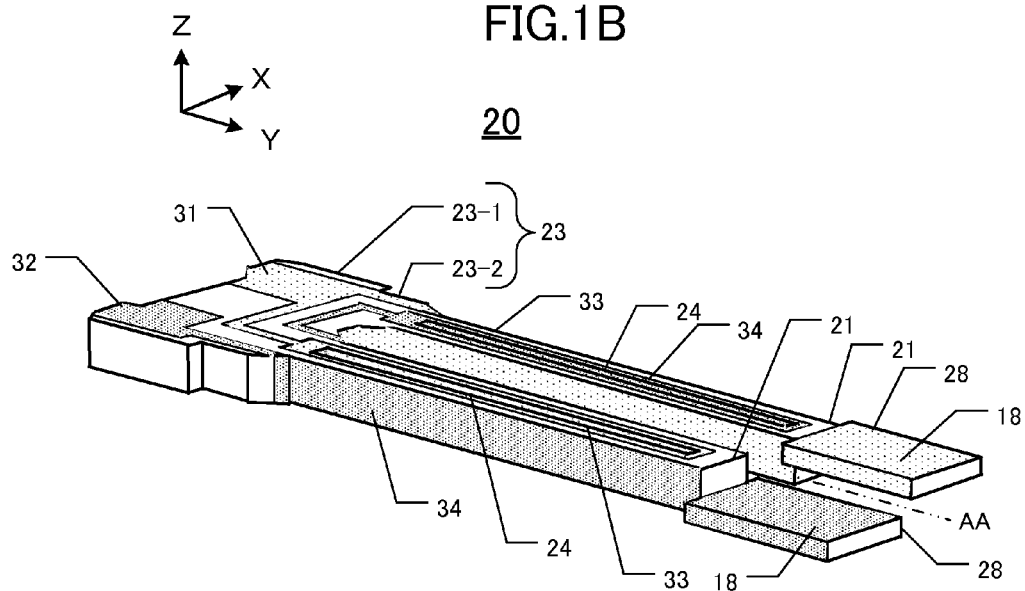
FIG. 1B is a perspective view of FIG. 1A.
Figure 1C:
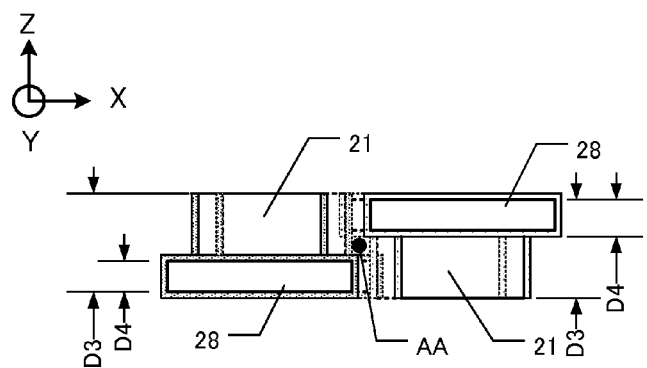
FIG. 1C is a cross-sectional view along A-A line of a pair of weight portions of the first tuning-fork type crystal vibrating piece 20.

FIG. 1A is a top view of a first tuning-fork type crystal vibrating piece 20 of a first embodiment. FIG. 1B is a perspective view of FIG. 1A. FIG. 1C is a cross-sectional view along A-A line of a pair of weight portions of the first tuning-fork type crystal vibrating piece 20.

A base material of a first tuning-fork type crystal vibrating piece 20 is a Z-cut single crystal wafer. As shown in FIG. 1A, the first tuning-fork type crystal vibrating piece 20 comprises a base portion 23 having a first base portion 23-1 and a second base portion 23-2, and a pair of vibrating arms 21, which is biforked and extends with a designated width (W3) from the first base portion 23-1 in Y direction. The distal ends of vibrating arms are provided with a pair of weight portions 28. The base portion 23 has a pair of connecting portions 27 for attaching the first tuning-fork type crystal vibrating piece 20 to a single crystal wafer temporarily.

The tuning-fork type crystal vibrating piece 20 is a very small vibrating piece oscillating at 32.768 kHz. In FIG. 1A, the weight portion 28 formed at the distal ends of the vibrating arms have a hammer-head portion with a constant width (W4). When the width of the hammer-head portion is increased, its volume also increases so that the weight of the weight portion becomes heavier. Thus, although the length of vibrating arms is short, frequency can be lowered. Also, as the dimensions of the weight portion 28 increase, the dimensions that fine adjustment of frequency is conducted by a laser beam are increased; therefore, fine adjustment of frequency can be conducted easily.

Grooves 24 are formed on the upper and the lower surfaces of the pair of vibrating arms 21 of the first tuning-fork type crystal vibrating piece 20. One groove 24 is formed on the upper surface of one vibrating arm 21 and one groove 24 is also formed on the lower surface of one vibrating arms 21. That is, four of grooves 24 are formed on the pair of vibrating arms 24. The depth of the groove 24 is about 35% to 45% of the thickness of the vibrating arm 21. The width of the groove 24 is about 65% to 85% of the width (W3) of the vibrating arm 21. The length of the groove 24 is 70% to 77% of the vibrating arm 21. The groove 24 is formed to lower CI value because CI value increases as it is miniaturized.

The base portion 23 of the first tuning-fork type crystal vibrating piece 20 is formed in a board-shape. The width (W2) of the first base portion 23-1 and the width (W1) of the second base portion 23-2 are differed. Because of the difference in the widths, oscillation leakage to the second base portion 23-1 can be reduced when the vibrating arms 23 oscillate in vertical direction. The base portion 23 has a pair of connecting portions 27 for attaching the first tuning-fork type crystal vibrating piece 20 to a single crystal wafer temporarily.

As shown in FIG. 1B, the cross-sections of the weight portions 28 formed at the distal ends of the vibrating arms 21 are formed point-symmetric about a central axis AA, which is a center line of the pair of vibrating arms. The weight portions 28 have a thickness which is less than the vibrating arm 21. One weight portion 28 is formed upper side on one vibrating arm 21 and the other weight portion 28 is formed lower side on the other vibrating arm 21 with reference to the central axis AA.

As shown in FIG. 1B, a first base electrode 31, a second base electrode 32, a first excitation electrode 33, and a second excitation electrode 34 are formed on the first tuning-fork type crystal vibrating piece 20 and the base portion 23. Metal films 18 are formed on the weight portions 28 formed at the distal ends of the vibrating arms 21. The first base electrode 31, the second base electrode 32, the first excitation electrode 33, the second excitation electrode 34, and the metal film 18 are formed with the same thickness. The metal film 18 is formed for frequency adjustment of the first tuning-fork type crystal vibrating piece 20. The first excitation electrode 33 and the second excitation electrode 34 are formed on the upper, the lower, and the side surfaces.

FIG. 1C is a cross-sectional view along A-A line of a pair of weight portions of the first tuning-fork type crystal vibrating piece 20. Dotted lines show a condition that the pair of vibrating arms 21 oscillates to center and respective weight portions 28 overlap when they are seen from Z direction. The weight portion 28 has a thickness D4, which is less than half of the thickness D3 of the vibrating arms 21. As a result an interspace is formed in thickness direction (Z direction) between respective weight portions 28. Because of this configuration, the pair of weight portions 28 do not collide with each other during flexion movement of the pair of vibrating arms 21. The thickness (D4) of the weight portion 28 is about 35% to 45% of the thickness D3 of the vibrating arm 21. The central portion and side edges of the weight portion 28 have the same thickness, resulting in a cross section of uniform thickness as shown in FIG. 1C. Hereinafter, it is the same fashion through the first to the fourth embodiment that increased width of the weight portion 28 makes the distal ends of the vibrating arms heavier and enables to lower frequency of the first tuning-fork type crystal vibrating piece 20 which is miniaturized, and also a pair of weight portions 28 does not collide with each other during movement of the vibrating arms 21.

<Configuration of First Crystal Device 100>

Figure 2A:
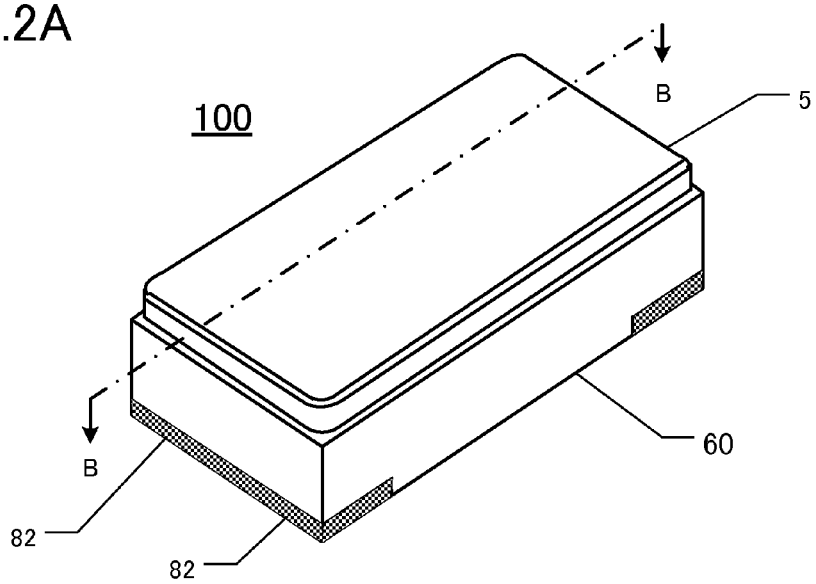
FIG. 2A is a perspective view of a first crystal device 100.
Figure 2B:
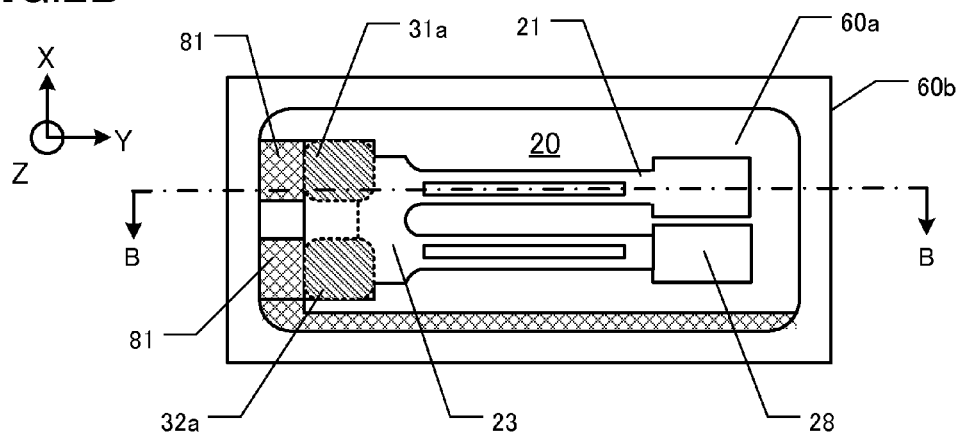
FIG. 2B is a top view of the first crystal device in which a first lid 5 is removed.
Figure 2C:
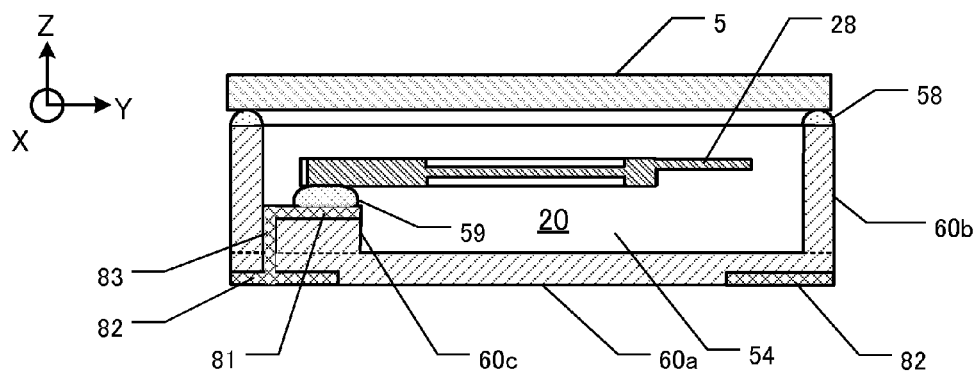
FIG. 2C is a cross-sectional view of the first crystal device 100.

The first crystal device 100 of each embodiment of present invention will be described by referring to the figures. FIG. 2A is a perspective view of a first crystal device 100. FIG. 2B is a top view of the first crystal device in which a first lid 5 is removed. FIG. 2C is a cross-sectional view of the first crystal device 100. For convenience, electrodes overlapping FIG. 1A to FIG. 1C will be omitted.

A surface-mounted first crystal device comprises an insulating ceramic package 60 and a glass-made first lid 5 covering the first tuning-fork type crystal vibrating piece 20. The first lid 5 is made of borosilicate glass or soda glass. The ceramic package 60 is comprised of a bottom ceramic layer 60a, a frame ceramic layer 60b, and a base 60c. The ceramic package 60 is formed by layering and burning a plurality of substrates formed by shaping ceramic green sheets made of mixture of aluminum oxide. As shown in FIG. 2C, the package comprised of the plurality of ceramic layers, 60a, 60b, and 60c forms a cavity 54 and the first tuning-fork type crystal vibrating piece 20 is packaged within the cavity 54.

An electrode pattern is formed on the vibrating arms 21 and the base portion 23 of the first tuning-fork type crystal vibrating piece 20. The electrode pattern of the base portion 23 has an adhesive area 31a, 32a of electrically conductive adhesive 59. The first tuning-fork type crystal vibrating piece 20 is bonded to be horizontal to the bottom ceramic layer 60a by the electrically conductive adhesive 59.

A conductive wiring 81 is formed on a part of a upper surface of the base 60c. The conductive wiring 81 conducts to the adhesive area 31a, 32a of the first tuning-fork type crystal vibrating piece 20. At least two of external electrodes 82 formed at a lower surface of the ceramic package 60 are external terminals when it is mounted on a non-illustrated print board. An internal wiring 83 is an electrically conductive portion connecting the conductive wiring and the external electrode 82. Adhesive 58 is applied on the frame ceramic layer 60b.

The ceramic package 60 is bonded to a glass-made first lid 5, which is transparent, by the adhesive 58 after the first tuning-fork type crystal vibrating piece 20 is mounted. Because the ceramic package 60 utilizes the transparent glass lid 5, in a vacuum state, a laser beam can be irradiated from outside to the metal film 18 (see FIG. 1) of the weight portions 28 to trim a part of the metal film 18. Frequency can be finely adjusted by this trimming of the metal film, which is called a volume reducing method. After this process, the first crystal device 100 is completed.

By increasing width of the weight portion 28, its volume also will increase so that frequency of individual first tuning-fork type crystal vibrating piece 20 can be lowered. Also, a range that frequency can be adjusted becomes larger and frequency can be adjusted easily to a desired frequency.

From FIG. 3 to FIG. 6 show alternative examples that the shapes of weight portions 28 of the vibrating arms 21 are modified. The same reference numerals are used for similar structures having the same functions.

First Alternative Example

<<Configuration of Second Tuning-Fork Type Crystal Vibrating Piece>>

Figure 3A:
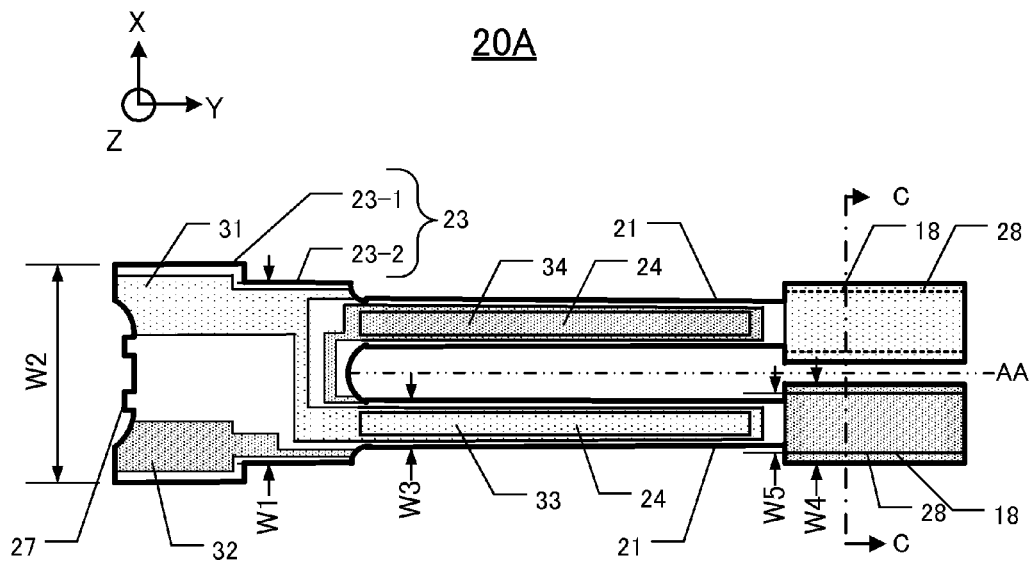
FIG. 3A is a top view of a second tuning-fork type crystal vibrating piece 20A of a first alternative example.
Figure 3B:
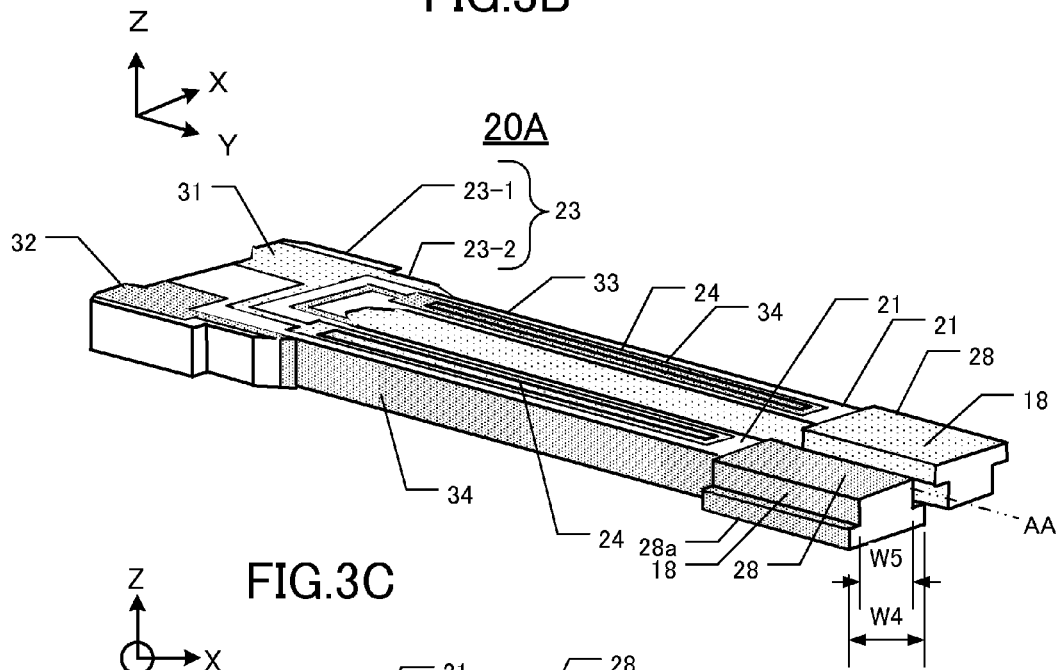
FIG. 3B is a perspective view of FIG. 3A.
Figure 3C:
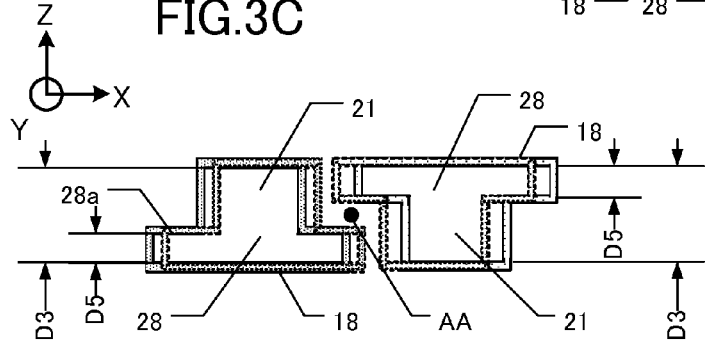
FIG. 3C is a cross-sectional view along C-C line of a pair of weight portions of the second tuning-fork type crystal vibrating piece 20A.

FIG. 3A is a top view of a second tuning-fork type crystal vibrating piece 20A of a first alternative example. FIG. 3B is a perspective view of FIG. 3A. FIG. 3C is a cross-sectional view along C-C line of a pair of weight portions of the second tuning-fork type crystal vibrating piece 20A.

As shown in FIG. 3A, the weight portion 28 of the vibrating arms 21 of the second tuning-fork type crystal vibrating piece 20A is a hammer-head shape, and the width W4 and W5 are wider than the width (W3) of the vibrating arms 21. The weight portion 28 has two different widths, a width W4 and W5, in thickness direction (Z direction) and the width W5 is narrower than the width W4. One weight portion 28 has a skirt 28a formed on one surface side such that the cross-section is T-section. The width of the weight portion 28 with the skirt 28a is width W4 and the width of the weight portion 28 without the skirt 28a is width W5. The width of the skirt 28a is the widest dimension of the weight portion 28. The cross-section of the other weight portion 28 is an inversed T-section.

As shown in FIG. 3B, the weight portion 28 can have the width W4 greater than the width W3 of the vibrating arm 21. This configuration enables to increase the volume of the weight portion 28 so that weight of the weight portion can be increased, and frequency of the second tuning-fork type crystal vibrating piece 20A can be lowered. Further, because the dimensions of the weight portion 28 are increased, the dimensions to which a laser beam is irradiated for fine frequency adjustment are increased. The first excitation electrode 33 and the second excitation electrode 34 are formed on the upper, the lower, and the side surfaces of the pair of vibrating arms 21, and the metal films 18 are formed on the pair of weight portions 28. The first excitation electrode 33 is connected to the first base electrode 31, and the second excitation electrode 34 is connected to the second base electrode 32.

As shown in FIG. 3C, the cross-section along the C-C line of the weight portion 28 is T-section and a thickness of the portion with the skirts 28a having the width W4 is D5, which has a thickness less than the half of the thickness D3 of the vibrating arm 21. Thus, the pair of vibrating arms 21 does not collide with each other at flexural movement because an interspace is formed between respective skirts 28a.

Second Alternative Example

<<Configuration of Third Tuning-Fork Type Crystal Vibrating Piece>>

Figure 4A:
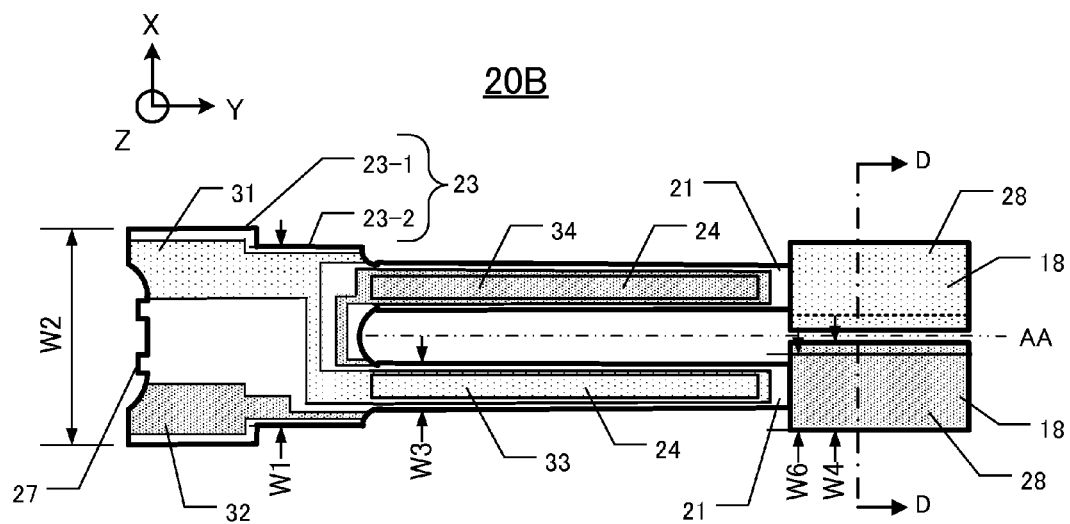
FIG. 4A is a top view of a third tuning-fork type crystal vibrating piece 20B of a second alternative example.
Figure 4B:
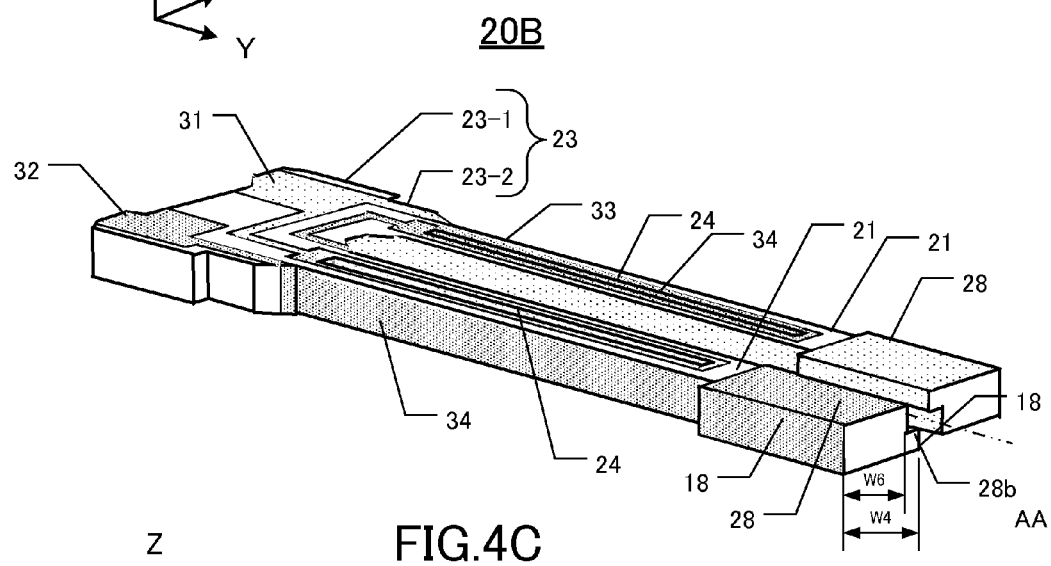
FIG. 4B is a perspective view of FIG. 4A.
Figure 4C:
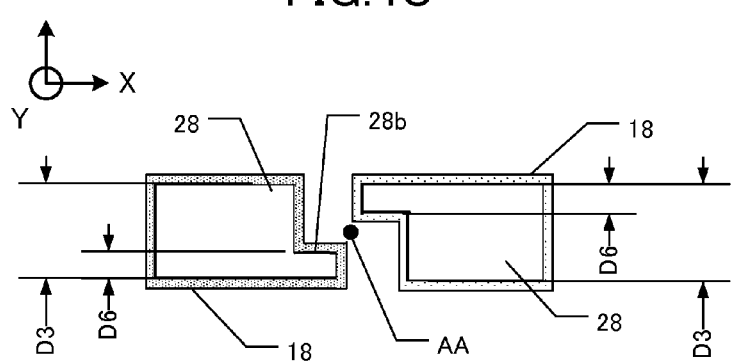
FIG. 4C is a cross-sectional view along D-D line of a pair of weight portions of the third tuning-fork type crystal vibrating piece 20B.

FIG. 4A is a top view of a third tuning-fork type crystal vibrating piece 20B of a second alternative example. FIG. 4B is a perspective view of FIG. 4A. FIG. 4C is a cross-sectional view along D-D line of a pair of weight portions of the third tuning-fork type crystal vibrating piece 20B.

As shown in FIG. 4A, the weight portion 28 of the vibrating arms 21 of the third tuning-fork type crystal vibrating piece 20B is a hammer-head shape, and the width W4 and W6 are wider than the width (W3) of the vibrating arms 21. The weight portion 28 has two different widths, a width W4 and W6, in thickness direction (Z direction) and the width W6 is narrower than the width W4. One weight portion 28 has a projection region 28b, which is formed in Y direction along one edge of inner side. The width of the weight portion 28 with the projection region 28b is a width W4 and its cross-section is an L-section. The cross-section of the other weight portion 28 is an inversed L-section.

As shown in FIG. 4B, the weight portion 28 can have the width W4 greater than the width W3 of the vibrating arm 21. This configuration enables to increase the volume of the weight portion 28 so that weight of the weight portion can be increased, and frequency of the third tuning-fork type crystal vibrating piece 20B can be lowered. Further, because the dimensions of the weight portion 28 are increased, the dimensions to which a laser beam is irradiated for fine frequency adjustment are increased. The first excitation electrode 33 and the second excitation electrode 34 are formed on the upper, the lower, and the side surfaces of the pair of vibrating arms 21, and the metal films 18 are formed on the pair of weight portions 28. The first excitation electrode 33 is connected to the first base electrode 31, and the second excitation electrode 34 is connected to the second base electrode 32.

As shown in FIG. 4C, the cross-section of the weight portion 28 is L-section and a thickness of the portion with the skirt 28b having the width W4 is D6, which has a thickness less than the half of the thickness D3 of the vibrating arm 21. The width of the skirt 28b is the widest dimension of the weight portion 28. Thus, the pair of vibrating arms 21 does not collide with each other at flexural movement because an interspace is formed between respective skirts 28b.

Third Alternative Example

<<Configuration of Fourth Tuning-Fork Type Crystal Vibrating Piece>>

Figure 5A:
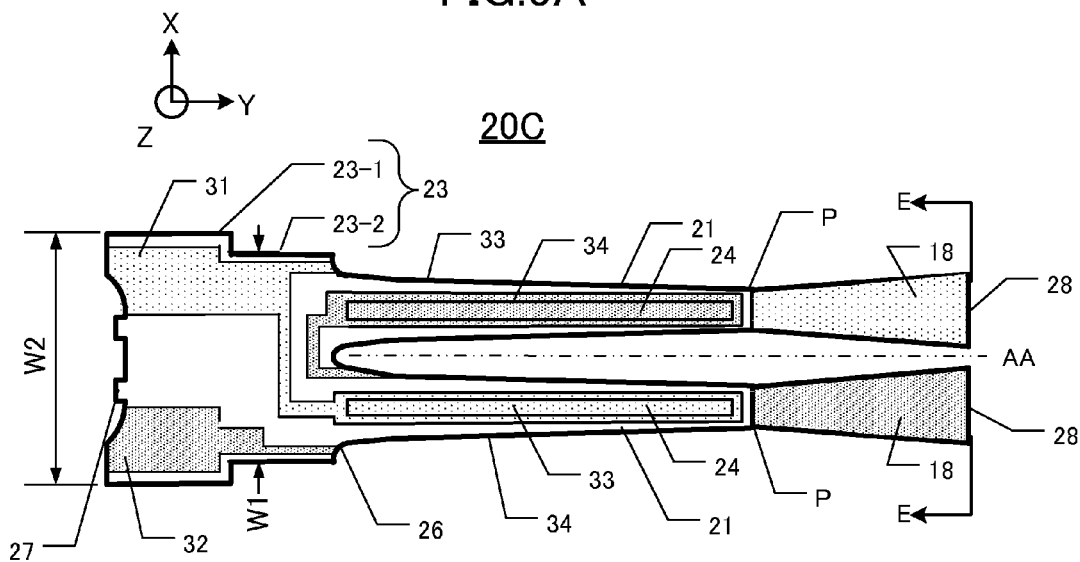
FIG. 5A is a top view of a fourth tuning-fork type crystal vibrating piece 20C of a third alternative example.
Figure 5B:
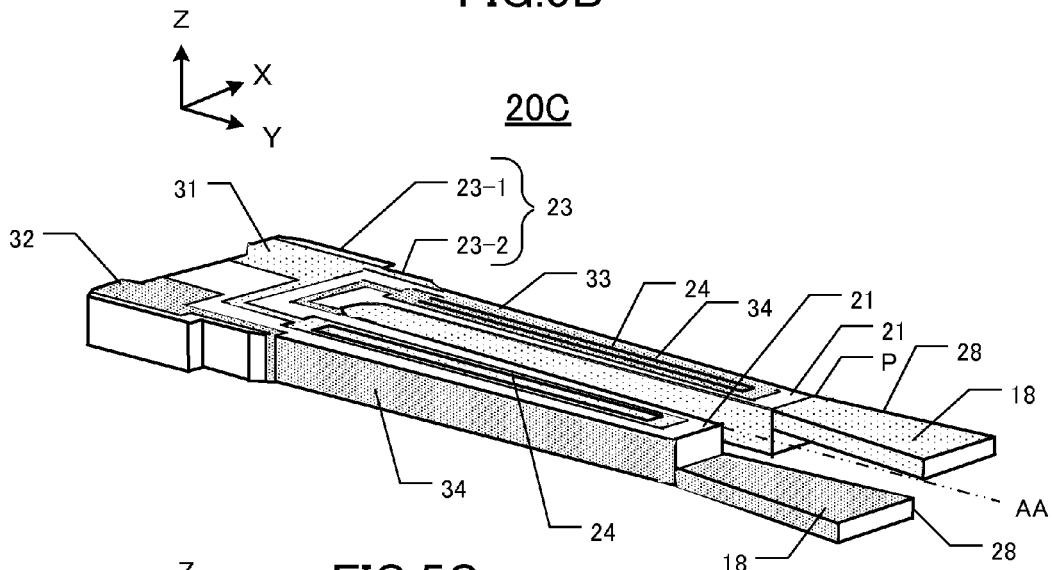
FIG. 5B is a perspective view of FIG. 5A.
Figure 5C:
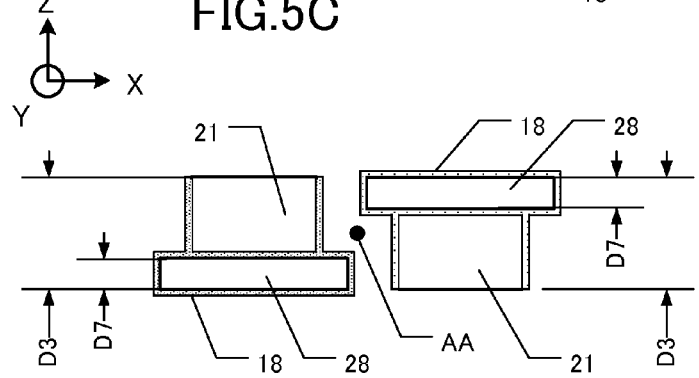
FIG. 5C is a cross-sectional view along E-E line of a pair of weight portions of the fourth tuning-fork type crystal vibrating piece 20C.

FIG. 5A is a top view of a fourth tuning-fork type crystal vibrating piece 20C of a third alternative example. FIG. 5B is a perspective view of FIG. 5A. FIG. 5C is a cross-sectional view along E-E line of a pair of weight portions of the fourth tuning-fork type crystal vibrating piece 20C.

As shown in FIG. 5A, the vibrating arm 21, which extends from the base portion 23 gradually becomes narrower from the root portion 26 to a changing point P. After passing the changing point P, the vibrating arm 21 gradually becomes wider such that the pair of vibrating arms does not collide with each other and forms fan-like shape weight portion 28.

Because of the above-mentioned configuration, the dimensions of the weight portion 28 is increased such that the weight portion 28 can adjust the frequency of the fourth tuning-fork type crystal vibrating piece 20C the fourth tuning-fork type crystal vibrating piece 20C. Further, stress concentrated at the root portion of the vibrating arms 21 transfers toward the distal ends of the vibrating arms so that oscillation leakage to the base portion 23 can be reduced. Also, by controlling the width of the changing point P (the constriction portion), CI value can be controlled and oscillation in second harmonic wave can be also prevented. Thus, the vibrating piece can oscillate stable fundamental wave.

As shown in FIG. 5B, when the width of the fun-like shape weight portion 28 is increased, the volume as well as the weight increases so that frequency can be lowered even though the length of vibrating arms is short. Also, because the dimensions of the weight portion 28 are increased, the dimensions to which a laser beam is irradiated are increased for fine frequency adjustment. The thickness of the weight portions 28 is formed thinner than that of the vibrating arms.

As shown in FIG. 5C, the thickness D7 of the fan-like shape weight portion 28 is formed thinner than half of the thickness D3 of the vibrating arm 21 so that an interspace is formed between the pair of weight portions in thickness direction (Z direction). As a result, even the pair of vibrating arms 21 overlaps at flexural movement, both arms do not collide with each other. The central portion and side edges of the weight portion 28 have the same thickness, resulting in a cross section of uniform thickness as shown in FIG. 5C.

Fourth Alternative Example

<<Configuration of Fifth Tuning-Fork Type Crystal Vibrating Piece>>

Figure 6A:
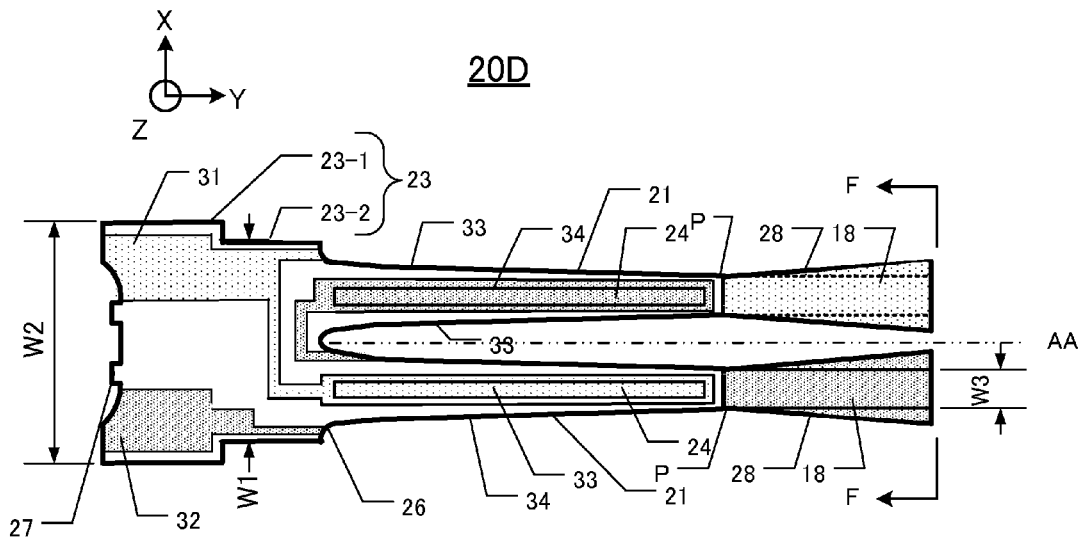
FIG. 6A is a top view of a fifth tuning-fork type crystal vibrating piece 20D of a fourth alternative example.
Figure 6B:
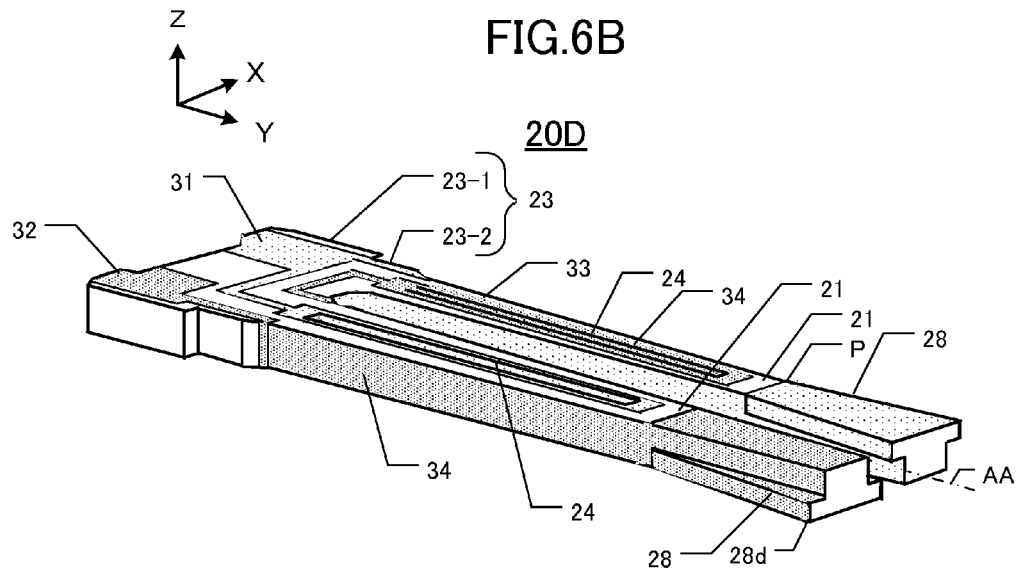
FIG. 6B is a perspective view of FIG. 6A.
Figure 6C:
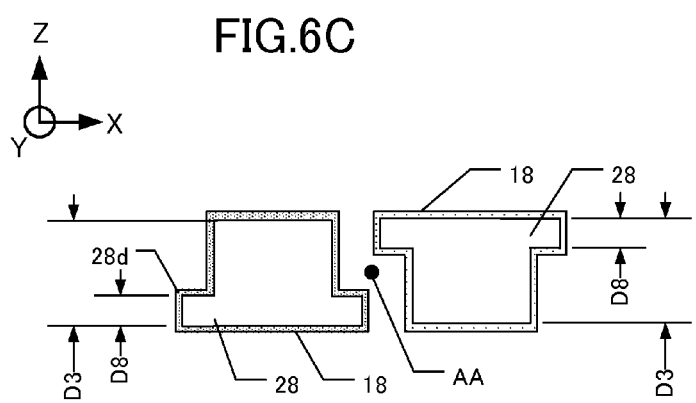
FIG. 6C is a cross-sectional view along F-F line of a pair of weight portions of the fifth tuning-fork type crystal vibrating piece 20D.

FIG. 6A is a top view of a fifth tuning-fork type crystal vibrating piece 20D of a fourth alternative example. FIG. 6B is a perspective view of FIG. 6A. FIG. 6C is a cross-sectional view along F-F line of a pair of weight portions of the fifth tuning-fork type crystal vibrating piece 20D.

As shown in FIG. 6A, the vibrating arms 21 extending from the base portion 23 gradually become narrower from the root portion 26 to a changing point P. The width of the vibrating arm 21 becomes the width W3 at the changing point P. After passing the changing point P, the vibrating arm 21 gradually becomes wider and forms a fan-like shape weight portion 28. The weight portion 28 having the width W3 extends with the same width W3 from the changing point P toward the distal end.

As shown in FIGS. 6A and 6B, one weight portion 28 has a skirt 28d formed on one surface side such that the cross-section is T-section. The width of the weight portion 28 with the skirts 28d is formed wider than of the width W3. The width of the skirt 28d is the widest dimension of the weight portion 28. The cross-section of the other weight portion 28 is an inversed T-section. A part of the weight portion 28 is formed with the same thickness of the vibrating arm 21, which is the width W3. The weight portion 28 shown in FIG. 6C has more thickness than the one shown in FIG. 5C so that the volume of the weight portion 28 shown in FIG. 6C increases. Therefore, the weight of the weight portion 28 also increases and frequency can be lowered. Also, because the dimensions of the weight portion 28 are increased, the dimensions to which a laser beam is irradiated for fine frequency adjustment are increased.

As shown in FIG. 6C, the thickness D8 of the skirts 28d of the weight portion 28 is formed thinner than half of the thickness D3 of the vibrating arm 21 so that an interspace is formed in thickness direction (Z direction) between the pair of weight portions. As a result, even the pair of vibrating arms 21 overlaps at flexural movement, both arms do not collide with each other.

<Manufacturing Steps of First Crystal Device 100>

Figure 7:
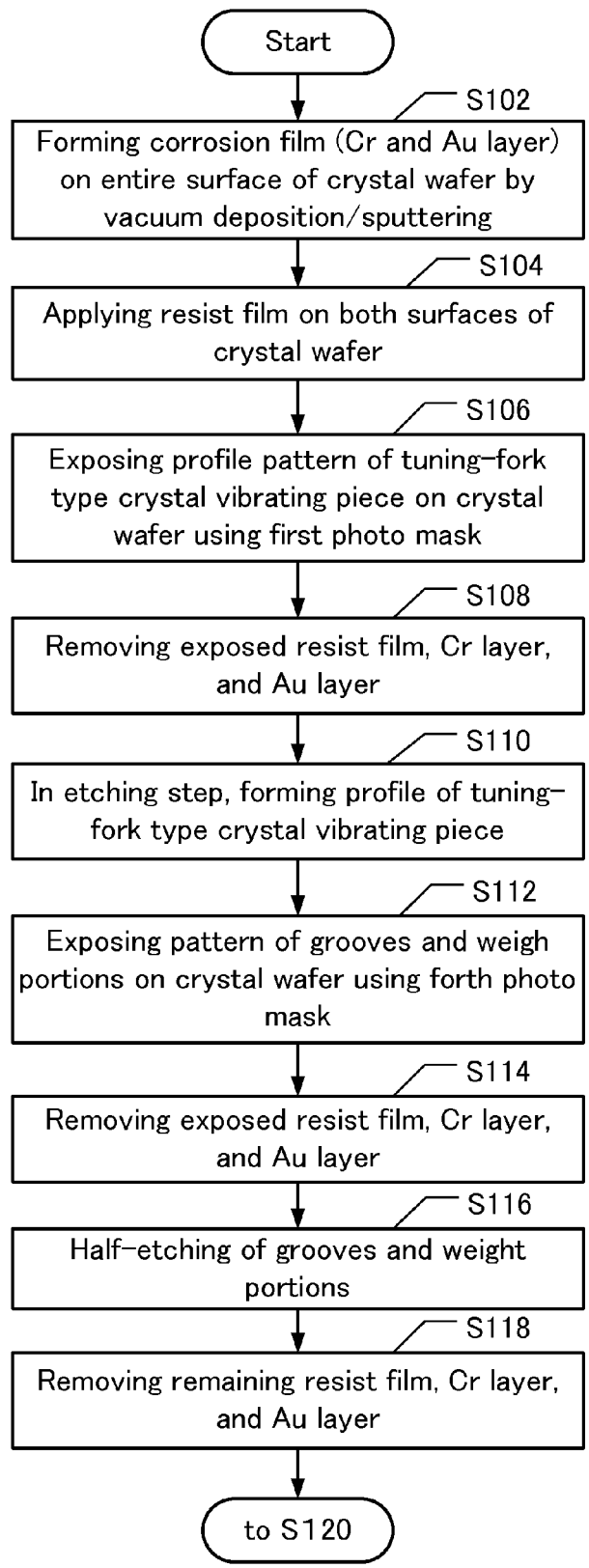
FIG. 7 is a flow chart showing steps of forming a profile, grooves, and weight portions of the first tuning-fork type crystal vibrating piece 20.
Figure 8:
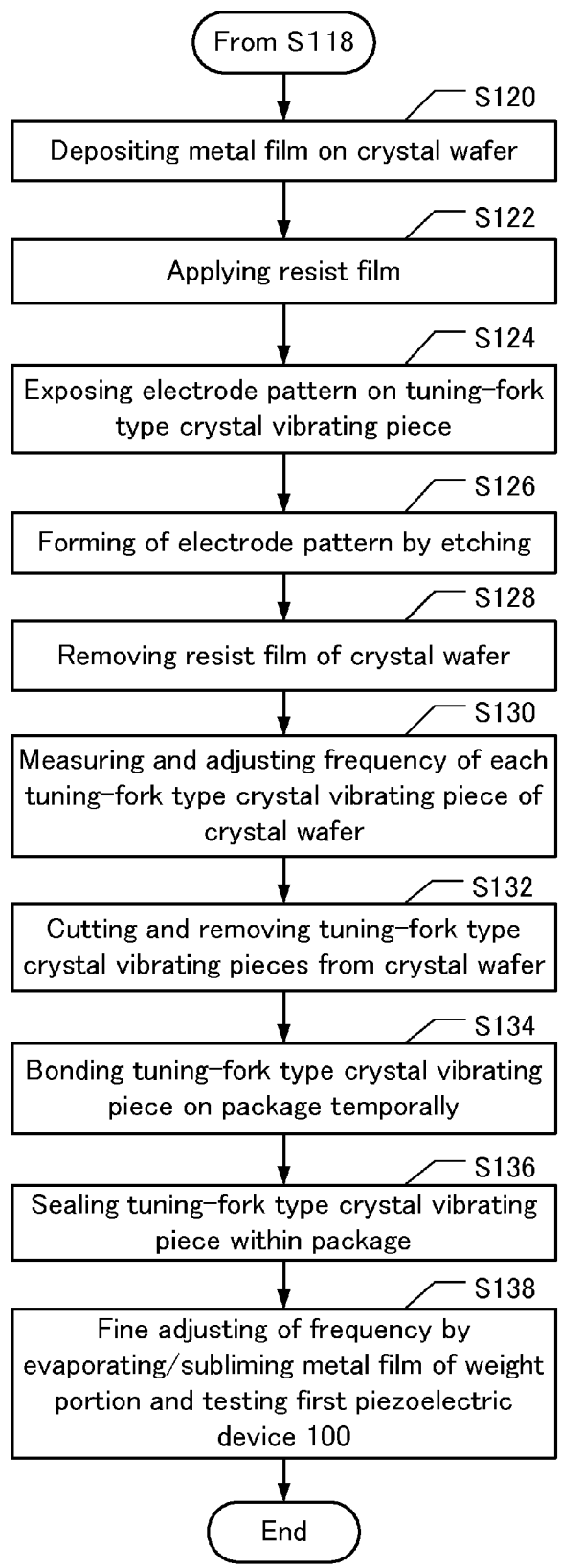
FIG. 8 is a flow chart showing steps of forming electrode and packaging.

FIG. 7 and FIG. 8 show flow charts for manufacturing a first crystal device, which is shown in FIG. 2 as a ceramic package, using the first tuning-fork type crystal vibrating piece 20 shown in FIG. 1. FIG. 7 is a flow chart showing steps of forming a profile, grooves, and weight portions of the first tuning-fork type crystal vibrating piece 20.

<Steps of Profile Forming of Crystal Vibrating Piece>

In step S102, a corrosion film is formed entire surface of a single crystal wafer by sputtering or deposition method. That is, when a single crystal wafer is used as a crystal material, it is difficult to form a gold (Au) or silver (Ag) layer directly on the single crystal wafer so that a chrome (Cr) or titanium (Ti) is used as a substrate. In this embodiment, the corrosion film is a double-layer metal film that an Au (gold) layer is layered on a Cr (chrome) layer.

In step S104, a photoresist layer is applied evenly by spin coating method on the single crystal wafer on which the corrosion film is formed. A positive photoresist such as novolak resin is used, for example, as the photoresist film.

In step S106, a profile pattern is exposed on a single crystal wafer (not shown) on which a photoresist film is formed using first photo mask 91 (see FIG. 9) by a non-illustrated exposing device. The profile pattern is exposed on both surfaces of the single crystal wafer in order to be etched from both surfaces.

In step S108, the photoresist film on the single crystal wafer is developed and exposed photoresist film is removed. Portions of the gold layer now revealed by removal of the exposed photoresist are etched using an aqueous solution of iodine and potassium iodide. Then, portions of the underlying chrome layer revealed by removing corresponding portions of the gold layer are etched using, for example, an aqueous solution of ceric di-ammonium nitrate and acetic acid.

In step S110, wet etching is conducted on the single crystal wafer revealed by removal of the photoresist film and the metal film using fluoride solution as an etchant so as to form the profile of the first tuning-fork type crystal vibrating piece 20.

Then, the first tuning-fork type crystal vibrating piece 20 is formed by removing unneeded photoresist film and metal film. Note that the single crystal wafer and the first tuning-fork type crystal vibrating piece 20 are still connected by the connecting portions 27 (see FIG. 1s). Thus, a plurality of first tuning-fork type crystal vibrating piece can be handle by a wafer level because of the connecting portions 27.

<Steps of Groove and Weight Portion Forming: First Example>

In step S112, to remaining photoresist film or to re-applied photoresist film, a fourth photo mask 96-1 corresponding to the grooves 24 and the weight portions 28 is used to expose the pattern on one surface (first surface) of the single crystal wafer, and a fourth photo mask 96-2 (see FIG. 10B) pattern is exposed on the other surface (second surface) of the single crystal wafer.

In step 114, after development of the photoresist film, exposed photoresist film is removed. Then, portions of the gold layer now revealed by removal of the exposed photoresist are etched. Next, portion of chrome layer revealed by removal of the gold layer is etched. The concentrations of these etchants, etching temperature, and etching time are controlled to avoid over-etch. Completion of etching results in complete removal of the metal film from the revealed locations.

In step S116, etching for the grooves 24 and the weight portions 28 are conducted. That is, a crystal material revealed from the photoresist film corresponding to the grooves 24 and the weight portions 28 is etched by wet etching so as to form the profiles of grooves 24 and the weight portions 28. The grooves 24 are half-etched for avoiding becoming a fully-penetrated hole. Generally, etchant such as fluoride acid does not easily flow into the grooves 24, but does easily flow into the weight portions 28 such as having a flat surface. Thus, the weight portion 28 is etched deeper than the grooves 24. For example, when the groove 24 of the vibrating arms 21 is etched 45% of its depth, the weight portion 28 is etched 55% of its depth. The cross section of the weight portion 28, as described with FIGS. 1B and 1C, have respective portions having increased width formed at different location in Z direction. The thickness of the weight portion 28 is thinner than half of a designated thickness of the vibrating arms 21 and an interspace is formed in thickness direction between the pair of the weight portions 28.

In step S118, unneeded photoresist film and metal film are removed. The grooves 27 and the weight portions 28 are formed by etching concurrently.

<Steps of Electrode Forming and Packaging>

FIG. 8 is a flow chart showing steps of forming electrode and packaging.

In step S120, the first tuning-fork type crystal vibrating piece 20 is washed by purified water, and then a metal film for forming an excitation electrode as a driving electrode is formed on entire surface of the first tuning-fork type crystal vibrating piece 20 by sputtering or deposition method.

In step S122, a photoresist film is applied on entire surface by spraying.

In step S124, a non-illustrated photo mask corresponding to the electrode pattern is prepared and the electrode pattern is exposed on the single crystal wafer on which the photoresist film is applied. The electrode pattern is needed to be formed on both upper and the lower surfaces of the first tuning-fork type crystal vibrating piece 20, so both electrode patterns are exposed on both surfaces.

In step S126, after development of the photoresist film, exposed photoresist film is removed. Remaining photoresist film becomes a photoresist film corresponding to the electrode pattern. Next, portions of the gold layer now revealed by removal of the exposed photoresist corresponding to the electrode pattern are etched using an aqueous solution of iodine and potassium iodide. Then, portions of the underlying chrome layer revealed by removing corresponding portions of the gold layer are etched using, for example, an aqueous solution of ceric di-ammonium nitrate and acetic acid.

In next step S128, the photoresist film is removed. After completion of those steps, the base electrode 31, 32, the excitation electrode 33, 34, and the metal film of the weight portions 28 are formed at right position and right electrode widths on the first tuning-fork type crystal vibrating piece 20.

In step S130, frequency of individual first tuning-fork type crystal vibrating piece 20 formed on a single crystal wafer is measured. Then, a laser beam is irradiated to the metal film 18 of the weight portions 28 to be a target frequency. Frequency is adjusted by trimming a part of the metal film 18, which is a mass reduction method. The dimensions of the weight portion 28 are formed wider, so a laser beam can be irradiated to large area. As a result of this configuration, frequency of a plurality of tuning-fork type crystal vibrating pieces is formed on a single crystal wafer, and can be finely adjusted to a target frequency even if respective vibrating pieces have different frequency.

In step S132, respective first tuning-fork type crystal vibrating pieces 20 are removed from a single crystal wafer by cutting the connecting portions 27.

<Step of Packaging>

After completion of steps described above, the first tuning-fork type crystal vibrating piece 20 on which electrodes are formed is achieved. In step S134, the first tuning-fork type crystal vibrating piece 20 is mounted on the base 60c of the ceramic package shown in FIG. 2 by electrically conductive adhesive 59. Particularly, the adhesive areas 31a, 32a of the base portion 23 of the first tuning-fork type crystal vibrating piece 20 are mounted on applied electrically conductive adhesive 59 and the adhesive 59 is hardened temporary. The adhesive areas 31a, 32a are connected to the adhesive 59.

In step S136, the ceramic package 60 on which the first tuning-fork type crystal vibrating piece 20 is mounted is placed in a vacuum chamber. And the first lid 5 is mounted on adhesive 58 and is bonded to the package 60. The electrically conductive adhesive 59 is then hardened permanently in a vacuum chamber to complete the first crystal device 100.

In step S138, fine adjustment of frequency of the first crystal device 100 can be conducted by irradiating a laser beam to the weight portion 28 of the vibrating arm 21 of the first tuning-fork type crystal vibrating piece 20 to evaporate/sublime the metal film 10 of the weight portion 28, which is a mass reduction method. Finally, tests such as driving characteristics are conducted and the first crystal device 100 is completed.

<Configuration of Exposing Mask>

Figure 9:
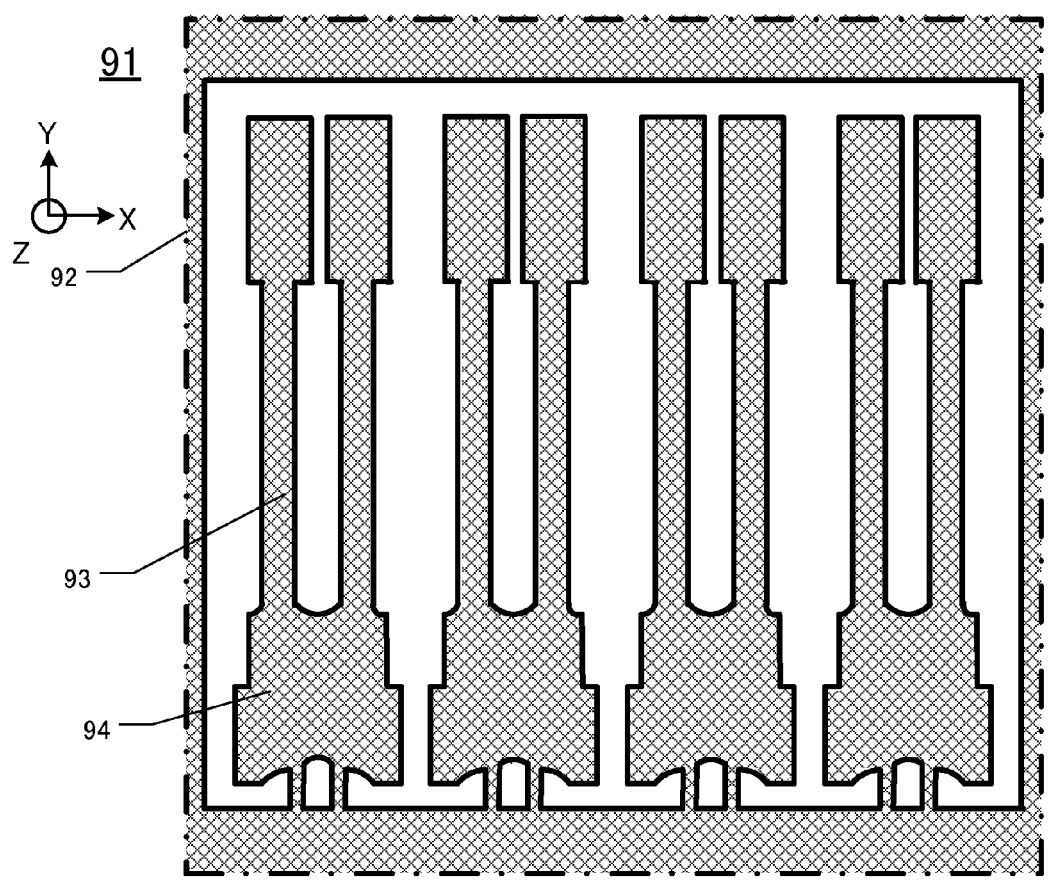
FIG. 9 is a top view of a first photo mask 91 for forming a profile of the first crystal frame 20.
Figure 10A:
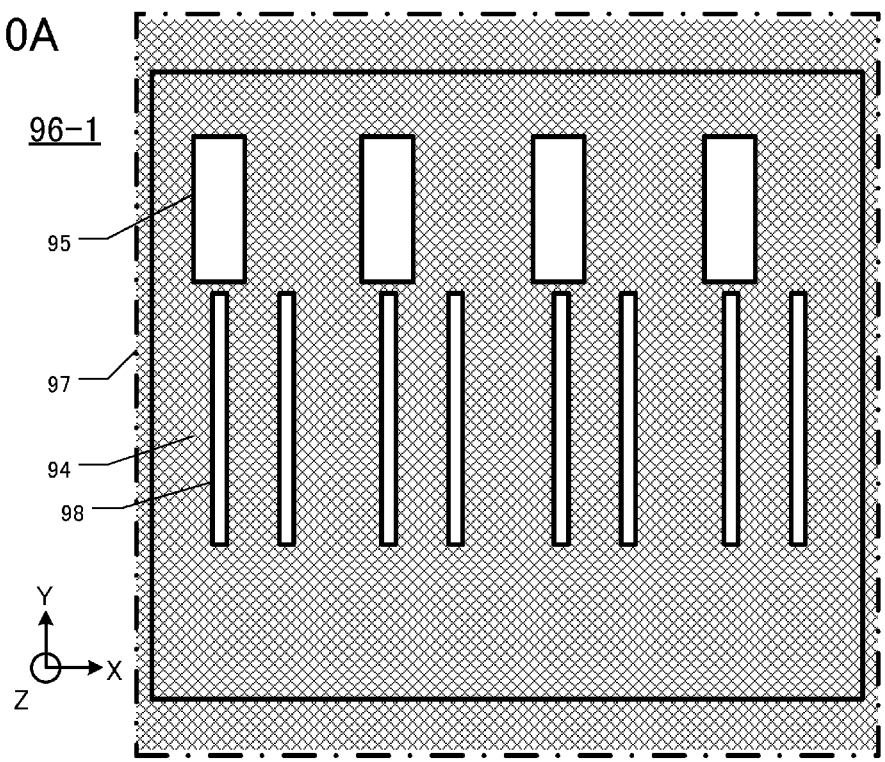
FIG. 10A is a top view of a fourth photo mask 96-1 for forming grooves 24 and weight portions 28.
Figure 10B:
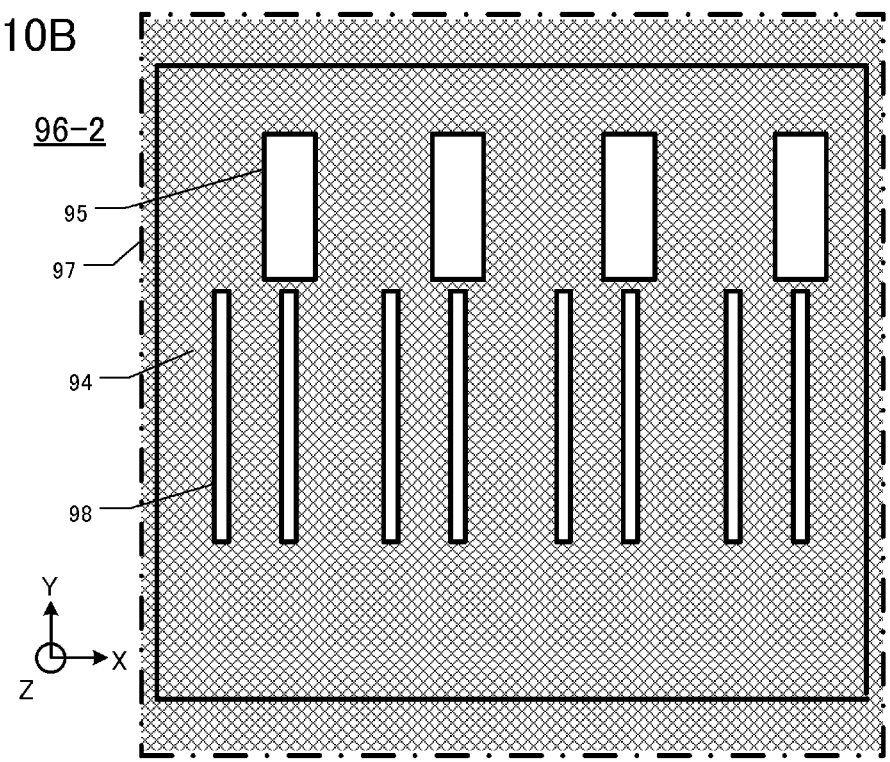
FIG. 10B is a top view of a fifth photo mask 96-2 for forming grooves 24 and weight portions 28.

FIG. 9, FIGS. 10A and 10B show top views of parts of a first and fourth photo mask for the first tuning-fork type crystal vibrating piece 20. Only four first tuning-fork type crystal vibrating pieces 20 are illustrated on those photo masks, but many of them are made for actual manufacturing. The same numberings will be used for the same members and only differences of the first and fourth photo masks will be described below.

When the photoresist layer is a positive photo resist film, a mask frame 92, 97, and a tuning-fork vibrating piece pattern 93 are light shielding areas. The light shielding areas drawn by chrome on a quartz glass are shown with shaded area 94, and other areas are remained as a quartz glass, which are clear areas, which include area 95 corresponding to the weight portions 28 and area 98 corresponding to the grooves 24. This embodiment will be explained on condition using a positive photoresist film.

FIG. 9 is a top view of a first photo mask 91 for forming a profile of the first crystal frame 20. For a better understanding, a profile of the mask frame 92 corresponding to the four first tuning-fork type crystal vibrating pieces 20 is illustrated with a virtual (dotted) line. The first photo mask 91 is for the first tuning-fork type crystal vibrating piece 20 shown in FIG. 1A. A plurality of the first tuning-fork type crystal vibrating pieces 20 is illustrated on the first photo mask 91 as well as alignment marks, which are not shown, for the right alignment.

In step S106 shown in FIG. 7, the first and the second surfaces of the single crystal wafer is exposed by using the first photo mask 91. Then in step S110, when the single crystal wafer is etched, profiles of many first tuning-fork type crystal vibrating pieces 20 are formed.

FIGS. 10A and 10B show top views of the fourth photo mask 96-1 and 96-2 for forming of the grooves 24 and weight portions 28. For a better understanding, a profile of the mask frame 97 corresponding to the four first tuning-fork type crystal vibrating pieces 20 is illustrated with a virtual (dotted) line.

FIG. 10A is a top view of a fourth photo mask 96-1 for forming grooves 24 and weight portions 28. FIG. 10B is a top view of a fifth photo mask 96-2 for forming grooves 24 and weight portions 28.

In step S112 shown in FIG. 7, the first surfaces of the single crystal wafer is exposed by using the fourth photo mask 96-1, and the second surface is exposed by using the fourth photo mask 96-2. Then in step S116, when the single crystal wafer is half-etched, profiles of the grooves 24 and the weight portions 28 are formed. Generally, etchant such as fluoride acid does not easily flow into the grooves 24, but it easily flows into the weight portions 28 having a flat surface. Therefore, the weight portion 28 is formed symmetrical with respect to a point of the central axis AA so that respective weight portions 28 have respective portions having increased width are formed at different location in Z direction.

<Forming Steps of Grooves and Weight Portions: Second Example>

The grooves and weight portions can be formed by following steps. As mentioned above, etchant does not easily flow into the grooves 24 but it easily flows into the weight portions 28. However, it is difficult to control the amount of etchant depend on portions to be etched. The steps to control/change the amount of etchant to the grooves 24 and the weight portions 28 will be explained below.

By replacing step S112 through step S118 described in the flow chart of FIG. 7 with step S212 through step S228, the amount of etchant for etching the grooves 24 and the weight portions 28 can be controlled.

In step S212, the second photo mask 196-1 (FIG. 12A) corresponding to the grooves 24 is used. The pattern of the second photo mask 196-1 is exposed on both first and second surface of the single crystal wafer where the photoresist film is still remained or on re-applied photoresist film.

In step S214, after development of the photoresist film, exposed photoresist film is removed. Then, portions of gold layers revealed by removal of the photoresist film are etched. Next, portions of chrome layers now revealed by removal of the gold layer are etched.

In step S216, grooves 24 are etched. That is, portions of crystal material revealed from the photoresist film corresponding to the grooves 24 are half-etched so as to form the grooves 24. This half-etching process is conducted only for the grooves 24; therefore, the depth of etching can be easily controlled with 35% to 45% of the thickness of the vibrating arm 21.

In step S218, unneeded photoresist film and metal film are removed.

In step S220, corrosion film (Cr and Au layer) is formed again by vacuum deposition/sputtering. Then, the photoresist film is formed on the corrosion film.

In step S222, on the single crystal wafer on which photoresist film is formed, the patterns of the third photo masks are exposed. The third photo mask 196-2 (see FIG. 12B) corresponding to the weight portions 28 is used on the first surface, and the third photo mask 196-3 (see FIG. 12C) is used on the second surface to expose respective patterns.

In step S224, after development of the photoresist film, exposed photoresist film is removed. Then, portions of gold layers revealed by removal of the photoresist film are etched. Next, portions of chrome layers now revealed by removal of the gold layer are etched.

In step S226, the weight portions 28 are etched. That is, portions of crystal material revealed from the photoresist film corresponding to the weight portions 28 are half-etched so as to form the weight portions 28. This half-etching process is conducted to etch equal to or more than 51% of the thickness of the vibrating arm 21. Because etching is conducted only for the weight portions 28, controlling desired depth achieved by the half-etching will be easy.

In step S228, unneeded photoresist film and metal film are removed. The grooves 24 and the weight portions 28 are etched with desired depth at respective etching steps.

Then, in next step S120 of FIG. 8, the electrode pattern is formed.

Figure 11:
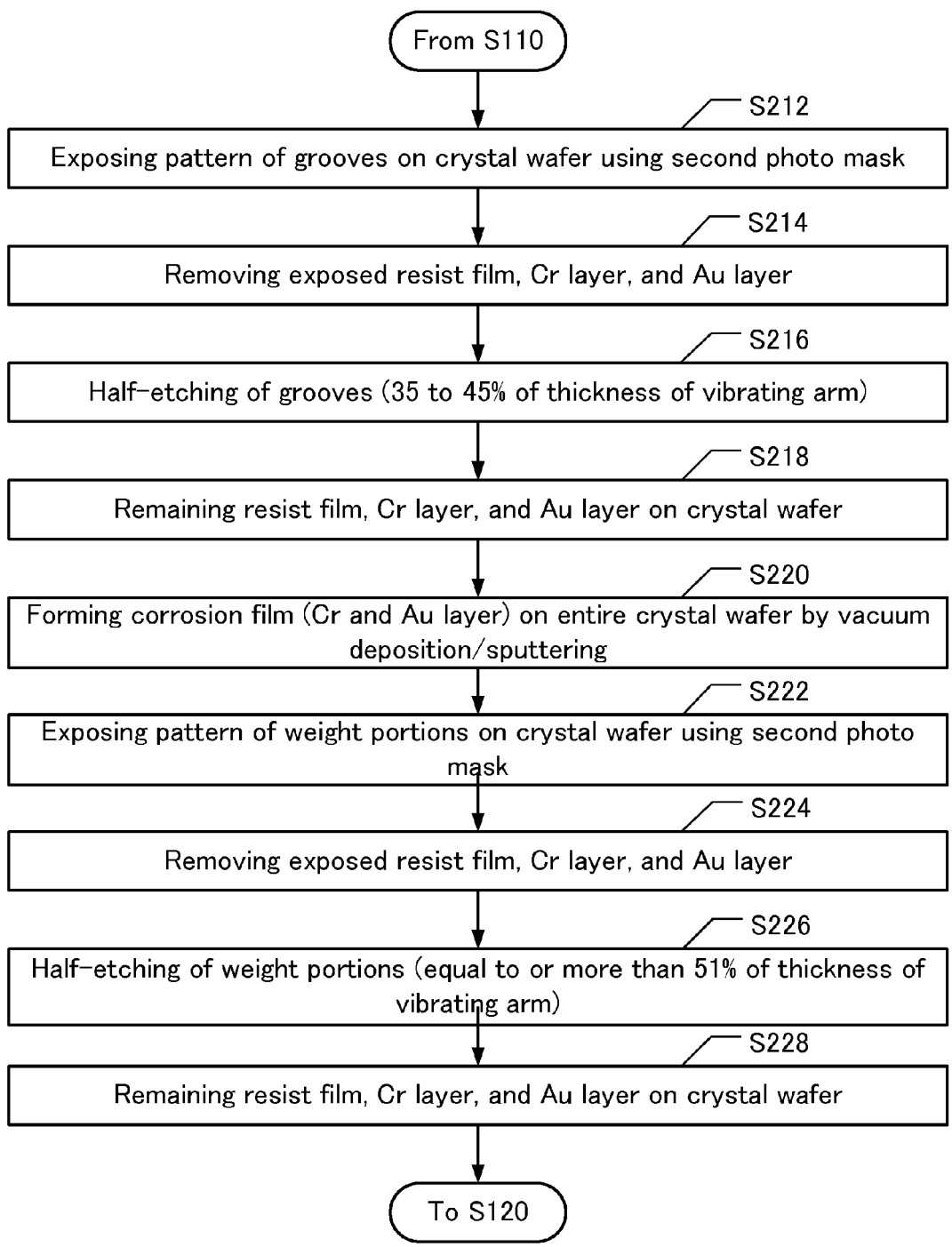
FIG. 11 is a flow chart showing steps forming the grooves and the weight portions of the first tuning-fork type crystal vibrating piece 20 individually.

Note that although the flow chart in FIG. 11 shows that the grooves 24 and the weight portions 28 are etched individually, the weight portions 28 can be half-etched first and then the grooves 24 can be half-etched.

FIG. 12A is a top view of a second photo mask 196-1 for forming the grooves 24. FIG. 12B is a top view of a third photo mask 196-2 for forming one side of weight portions 28. FIG. 12C is a top view of a third photo mask 196-3 for forming the other side of weight portions 28. For a better understanding, a profile of the mask frame 97 of the second photo mask 196-1, the third photo mask 196-2 and 196-3 are drawn with a virtual (dotted) line.

Second Embodiment

Figure 13A:
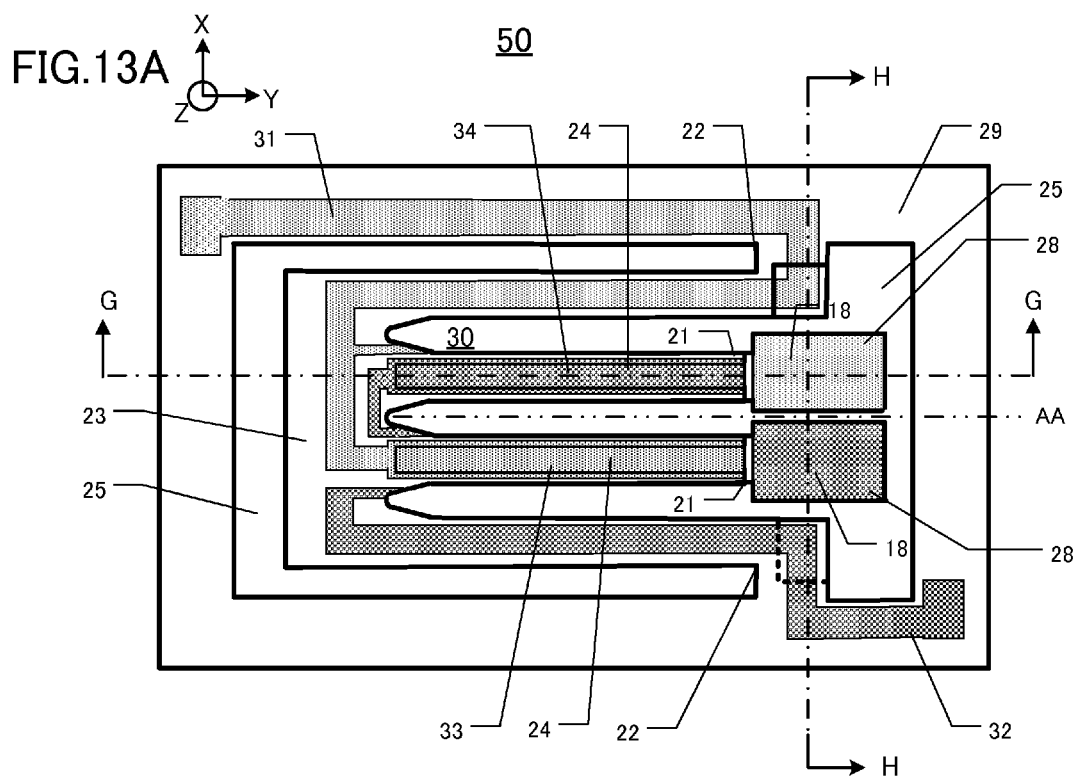
FIG. 13A is a top view of a crystal frame 50 comprising a sixth tuning-fork type crystal vibrating piece 30 of a second embodiment.
Figure 13B:
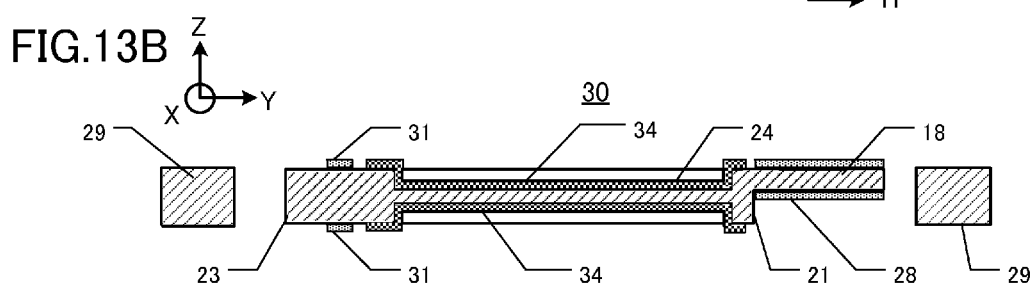
FIG. 13B is a cross-sectional view taken along G-G line of FIG. 13A.
Figure 13C:
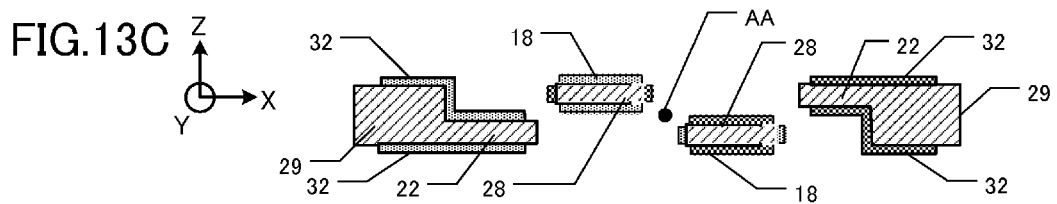
FIG. 13C is a cross-sectional view taken along H-H line of FIG. 13B.

FIG. 13A through 13C show a crystal frame 50 having the sixth tuning-fork type crystal vibrating piece 30 of second embodiment. The same numberings are used for the same members.

FIG. 13A is a top view of a crystal frame 50 comprising a sixth tuning-fork type crystal vibrating piece 30 of a second embodiment. FIG. 13B is a cross-sectional view taken along G-G line of FIG. 13A. FIG. 13C is a cross-sectional view taken along H-H line of FIG. 13B. One major difference between the crystal frame 50 of the second embodiment and the first tuning-fork type crystal vibrating piece 20 shown in the first embodiment is that the sixth tuning-fork type crystal vibrating piece 30 is surrounded by a crystal frame portion 29. The sixth tuning-fork type crystal vibrating piece 30 is supported by the supporting arms 22 extend outsides of the vibrating arms 21 from the base potion 23, and the supporting arms 22 are connected to the crystal frame portion 29.

The pair of supporting arms 22 extends in Y direction which the pair of vibrating arms 21 extends from the base portion 23 and connects to the crystal outer frame portion 29. The pair of supporting arms 22 reduces oscillation leakage to the exterior from the vibrating arms 21, and also reduces affect of temperature change of external of the package and dropping impact. Thus, the pair of supporting arms 22 extends not farther than the distal ends of the weight portions 28.

As shown in FIG. 13A, the crystal frame 50 is comprised of the sixth tuning-fork type crystal vibrating piece 30 comprising the base portion 23 and the vibrating arms 21, the crystal frame portion 29, and the supporting arms 22. A space 25 is formed between the outer frame portion 29 and the sixth tuning-fork type crystal vibrating piece 30. The crystal frame 50 is provided with a first base electrode 31 and a second base electrode 32 extending from the base portion 23 to the crystal outer frame portion 29 via the supporting arms 22. The sixth tuning-fork type crystal vibrating piece 30 is a very small vibrating piece oscillating at 32.768 kHz.

The shapes of a vibrating arm root portion comprising the base 23 and the pair of vibrating arms 21 and of supporting arms root portions comprising the base 23, the vibrating arms 21, and the supporting arms 22 are U-shape with relatively straight line. The sixth tuning-fork type crystal vibrating piece 50 is symmetric with respect to the Y axis because respective vibrating arms 21 and respective supporting arms 22 have the same widths and lengths and also respective root portions have the same shapes. Thus, the piece has a well balanced configuration.

The weight portion 28 has a hammer-head shape having a constant width. When the width or the hammer-head shape portion is widened, it's volume increases and the weight of the weight portion also increases. Thus, it enables to lower frequency even the length of the vibrating arms 21 is short. Also, because the dimensions of the weight portion 28 are increased, the dimensions that the fine adjustment frequency is conducted by a laser beam are increased.

As shown in FIGS. 13A and 13C, the weight portion 28 is formed symmetrical with respect to a point of the central axis AA. Respective weight portions 28 having increased width are formed at the upper side and the lower side of the distal ends of the vibrating arms in Z direction. Therefore, the pair of vibrating arms 21 does not collide with each other at flexural movement. As shown in FIG. 13C, in order to avoid the weight portion 28 having increased width to collide with the supporting arms 22, the supporting arms 22 have concave portions with respect to respect portions. The weight portions 28 of the sixth tuning-fork type crystal vibrating piece 30 can have the weight portion 28 formed according to the first alternative example to the fourth alternative example.

The first excitation electrode 33 and the second excitation electrode 34 are formed on the upper, the lower, and the side surfaces of the pair of vibrating arms 21. The first excitation electrode 33 is connected to the first base electrode 31 and the second excitation electrode 34 is connected to the second base electrode 32.

Manufacturing steps of the crystal frame 50 is the same as steps of the profile forming shown in FIG. 7. In the first exposing step same as the step S106 of FIG. 7, a pattern of first photo mask corresponding to the profile of the crystal frame 50, which is not illustrated, is exposed on a first and a second main surfaces of the single crystal wafer. Profiles of the fifth tuning-fork type crystal vibrating piece 30, the crystal outer frame portion 29, the base portion 23, and the supporting arms 22 are illustrated on the first photo mask. Then in step S110, a first wet etching is conducted on the single crystal wafer, a plurality of profiles of crystal frame 50 is formed. Note that many of the crystal frames 50 are formed on the single crystal wafer concurrently.

In the step S112 shown in FIG. 7, a second exposing is conducted by using a non-illustrated fourth photo mask. Patterns of grooves and weight portions, and a part of the supporting arms 22 of the crystal frame 50 are illustrated on the fourth photo mask. Then in a second etching step of the step S116, the grooves 24, the weight portions 28, and a part of the supporting arms 22 are half-etched. Respective portions of the weight portions 28 and the supporting arms 22 are formed thinner than the vibrating arms so that the pair of vibrating arms 21 does not collide with each other or with the supporting arms 22 at flexural movement.

According to the flow chart shown in FIG. 11, the second photo mask for grooves 24 and the third photo mask for the weight portions 28 and a part of the supporting arms 22 are prepared. Respective patterns are exposed individually by half-wet etching in order to control respective depths.

<Configuration of Second Crystal Device 110>

FIG. 14 is a schematic view of the second crystal device 11 of the second embodiment. The second crystal device 11 has the crystal frame 50, and the crystal frame portion 20 of the crystal frame 50 is sandwiched and bonded between the second lid 10 and the base 40.

Figure 14A:
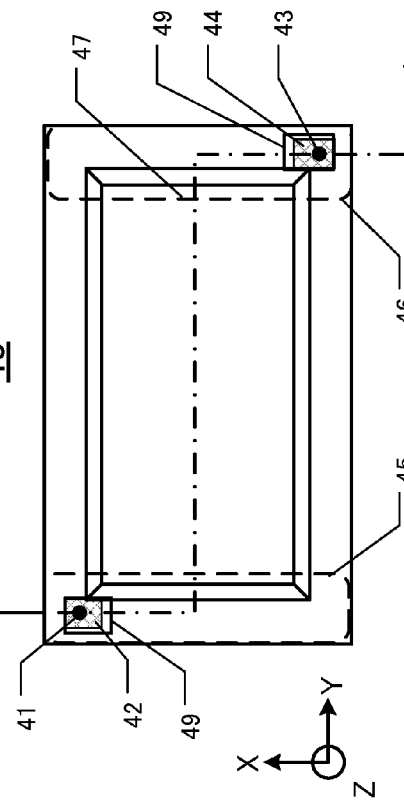
FIG. 14A is a top view of a second lid 10 made of a single crystal wafer.
Figure 14C:
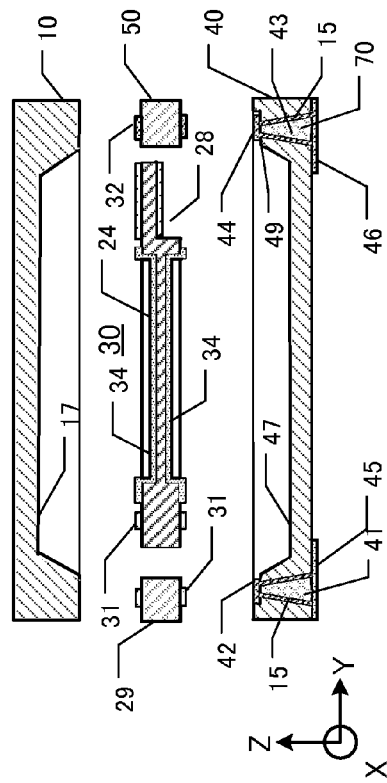
FIG. 14C is a top view of a base 40 made of a single crystal wafer.
Figure 14B:
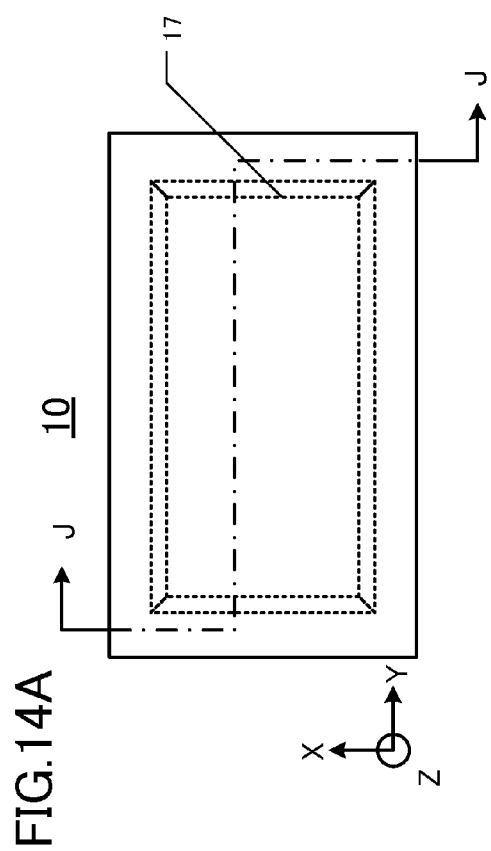
FIG. 14B is a top view of a crystal frame 50 having a sixth tuning-fork type crystal vibrating piece 30.
Figure 14D:
FIG. 14D is a simplified cross-sectional view along J-J line of FIG. 14A to FIG. 14C where before three wafers are layered to complete a second crystal device 110.

FIG. 14A is a top view of a second lid 10 made of a single crystal wafer. FIG. 14B is a top view of a crystal frame 50 having a sixth tuning-fork type crystal vibrating piece 30. FIG. 14C is a top view of a base 40 made of a single crystal wafer. FIG. 14D is a simplified cross-sectional view along J-J line of FIG. 14A to FIG. 14C where before three wafers are layered to complete a second crystal device 110.

As shown in FIG. 14A, the second lid 10 has a concavity 17 that faces the crystal frame 50. FIG. 14B has the same configuration of the one of the FIG. 13A, so explanation will be omitted.

As show in FIG. 14C, the base 40 has a concavity 47 that faces the crystal frame 50. A first through-hole 41, a second through-hole 43, and step portions 49 are formed on the base 40 as the concavity 47 is formed by etching. A first connecting electrode 42 and a second connecting electrode 44 are formed on the upper surface of the base 40.

As shown in FIGS. 14C and 14D, a metal film 15 is formed inside of the first through-hole 41 and the second through-hole 43. The metal film 15 is formed by photolithography step as the first and the second connecting electrode 42, 44 are formed. The metal film 15 is a gold (Au) layer or a silver (Ag) layer providing a chrome (Cr) layer as substrate. The base 40 is provided with a first external electrode 45 and a second external electrode 46 metalized on the bottom. The first connecting electrode 42 is connected to the first external electrode 45 formed on the bottom via the first through-hole 41. The second connecting electrode 44 is connected to the second external electrode 46 formed on the bottom via the second through-hole 43.

The first base electrode 31 and the second base electrode 32 formed on the lower surface of the crystal outer frame portion 29 are connected to the first connecting electrode 42 and the second connecting electrode 44 formed on the upper surface of the base 40 respectively. That is, the first base electrode 31 is electrically connected to the first external electrode 45, and the second base electrode 32 is electrically connected to the second external electrode 46.

As shown in FIG. 4D, the second lid 10 (FIG. 14A), the crystal frame 50 (FIG. 14B), and the base 40 (FIG. 14C) are layered and bonded by siloxane bonding to form the second crystal device 110. In actual manufacturing, hundreds or thousands of crystal frame 50, the second lids 20, and the bases 40 are formed respect single crystal wafers, and the those wafers are bonded to form hundreds or thousands of second crystal devices 110.

For siloxane bonding of the second lid 10, the crystal outer frame portion 29, and the base 40, the surfaces of those wafers are mirrored and short wavelength ultraviolet light is irradiated to the mirrored-surfaces to activate them for siloxane bonding. Even the thickness of the electrodes (3000 to 4000 Å) will be a cause of bonding failure. Therefore, the surface corresponding to the first base electrode 31 and the second base electrode 32 formed on the lower surface must have respective concavities having a depth more than the thickness of the electrodes. Also, for the first connecting electrode 42 and the second connecting electrode 44 formed on the upper surface of the second base 40A, step portions 49 having a depth which is the same as the thickness of the connecting electrodes must be formed. That means that the bonding surfaces need to have concavities corresponding to the electrodes and surfaces accommodating the electrodes for inhibiting siloxane bonding.

After siloxane bonding the first through-hole 41 and the second through-hole 43 of the second crystal device 110 are sealed. For example, a sealing material of gold-germanium alloy 70 is placed on the first and the second through-holes 41, 43, and the second crystal device 110 is placed in a reflow furnace which is a vacuum state or filled with an inactive gas. As a result, the second crystal device 110 in which inside is vacuumed or filled with inactive gas is formed.

The second crystal device 110 of the present invention is adjusted its frequency during manufacturing. After the frequency of the sixth tuning-fork type crystal vibrating piece 30 is measured, a laser light is irradiated to the metal film formed on the weight portions 28 to evaporate/sublime the metal film for adjustment of frequency. Finally, driving test of the second crystal device 110 is conducted to complete the device 110.

Figure 15A:
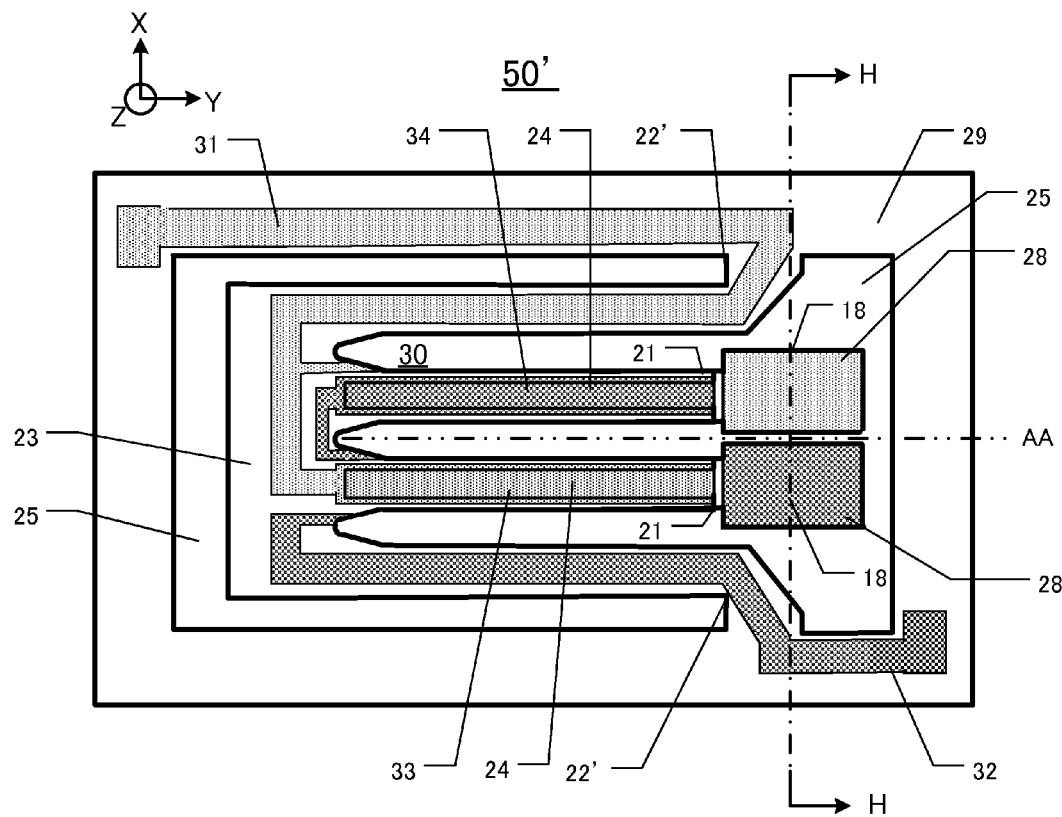
FIG. 15A is a top view of a crystal frame 50 comprising a seventh tuning-fork type crystal vibrating piece 30 of a second embodiment.
Figure 15B:
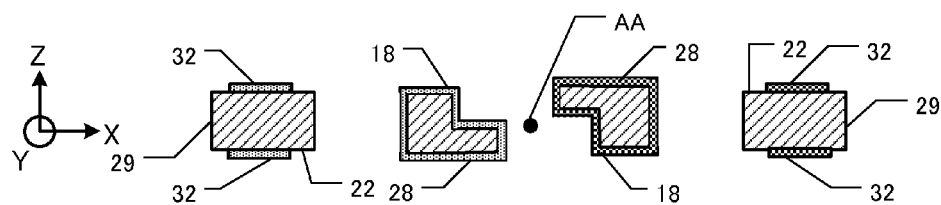
FIG. 15B is a cross-sectional view along H-H line of FIG. 15A.

FIGS. 15A and 15B show a crystal frame 50' comprising the seventh tuning-fork type crystal vibrating piece 30 of the second embodiment. The same numberings are used for the same members.

FIG. 15A is a top view of a crystal frame 50 comprising a seventh tuning-fork type crystal vibrating piece 30 of a second embodiment. FIG. 15B is a cross-sectional view along H-H line of FIG. 15A. The weight portions 28 shown in FIG. 15B are formed in the same shape of the third tuning-fork type crystal vibrating piece 20B shown in FIG. 4.

The pair of supporting arms 22' extends from the base portion 23 and in Y direction, which the same directions the vibrating arms 21 extend and connects to the crystal outer frame portions 29, but is etched to form an angle from the top view so as not to collide to the weight portions 28.

The weight portions 28 shown in FIGS. 15A and 15B are formed larger and heavier than the weight portions 28 shown in FIG. 13A. Therefore, frequency can be lowered even the length of the vibrating arms 21 is short, and also the dimensions of the weight portion 28 can be formed larger and the dimensions that the fine adjustment frequency is conducted by a laser beam are increased.

Preferred embodiments of the disclosed piezoelectric vibrating devices have been described above with a tuning-fork type crystal vibrating piece, but it is not limited to it, and for example, various kinds of piezoelectric single crystal materials, such as lithium niobate can be used instead of crystal. Also, it can be applied for a crystal oscillator having an oscillation circuit, such as IC, inside of a crystal device.

What is claimed is:

1. A tuning-fork type crystal vibrating piece comprising:
   a base portion comprising a piezoelectric material;
   a pair of vibrating arms extends parallel from the base portion and having a central axis equidistant from and parallel to said vibrating arms, each of said vibrating arms having a designated thickness and width between said base portion and a distal end, said designated thickness having equal portions above and below said central axis; and
   a weight portion formed at the distal end of each vibrating arm by enlarging the width of each said distal end; wherein the width of each weight portion includes a peripheral portion having a thickness which is less than the designated thickness, and when the pair of vibrating arms oscillates, said peripheral portions move in parallel planes spaced apart from and separated by said central axis.

2. The tuning-fork type crystal vibrating piece of claim 1, wherein said peripheral portion of each weight portion adjacent said central axis has a thickness less than a remainder of each said weight portion.

3. The tuning-fork type crystal vibrating piece of claim 1, wherein said peripheral portion of each weight portion has a thickness less than half said designated thickness.

4. The tuning-fork type crystal vibrating piece of claim 1, wherein a width of said peripheral portion varies from a distal end of each weight portion toward the base portion.

5. The tuning-fork type crystal vibrating piece of claim 1, wherein each of said peripheral portions gradually decrease in width from the distal ends of the weight portions toward the base portion.

6. The tuning-fork type crystal vibrating piece of claim 1, wherein the peripheral portion has the widest dimension of the weight portion.

7. The tuning-fork type crystal vibrating piece of claim 1, wherein the whole weight portion has the same thickness as the peripheral portion.

8. A piezoelectric frame comprising:

a base portion comprising a piezoelectric material;

a pair of vibrating arms extends parallel from the base portion to a distal end and having a central axis equidistant from and parallel to said vibrating arms, each of said vibrating arms having a designated thickness and width;

a pair of weight portions formed by enlarging the width of the distal end of each vibrating arm;

an outer frame portion surrounding the base portion and the vibrating arms; and supporting arms extending between said outer frame and said base portion, thereby supporting said base portion and said vibrating arms with respect to said outer frame;

wherein each said weight portion includes a peripheral portion having a thickness which is less than the designated thickness, said peripheral portions formed on each said weight portion so that the peripheral portions adjacent said central axis may overlap during oscillation without touching each other.

9. The piezoelectric frame of claim 8 wherein a portion of the supporting arm has a thickness less than the designated thickness.

10. The piezoelectric frame of claim 9, wherein said weight portions include a central portion intermediate inner and outer peripheral portions and both said inner and outer peripheral portions of each of said weight portion have a thickness that is less than a thickness of said central portion.

11. The piezoelectric frame according to claim 8, wherein each said weight portion has a width and a distal end and the width of each said peripheral portion varies from the distal end of the weight portion toward the base portion.

12. The piezoelectric frame according to claim 8, wherein said weight portions have a thickness less than half of the designated thickness of the vibrating arms.

13. The piezoelectric frame according to claim 8, wherein said weight portions include adjacent inner peripheral portions having a thickness less than half the designated thickness of the vibrating arms and one of said inner peripheral portions is formed adjacent a top side of the vibrating arm from which it extends and the other of said inner peripheral portions is formed adjacent a bottom side of the vibrating arm from which it extends so that said inner peripheral portions move in parallel planes spaced apart from said central axis.

14. The piezoelectric frame of claim 8, wherein the peripheral portion has the widest dimension of the weight portion.

15. The piezoelectric frame of claim 8, wherein the whole weight portion has the same thickness as the peripheral portion.

* * * * *